United States Patent
Togo et al.

(10) Patent No.: US 7,442,632 B2
(45) Date of Patent: Oct. 28, 2008

(54) SEMICONDUCTOR DEVICE N-CHANNEL TYPE MOS TRANSISTOR WITH GATE ELECTRODE LAYER FEATURING SMALL AVERAGE POLYCRYSTALLINE SILICON GRAIN SIZE

(75) Inventors: Mitsuhiro Togo, Kanagawa (JP); Takayuki Suzuki, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 136 days.

(21) Appl. No.: 11/635,505

(22) Filed: Dec. 8, 2006

(65) Prior Publication Data

US 2007/0080393 A1    Apr. 12, 2007

(30) Foreign Application Priority Data

Dec. 9, 2005    (JP) .............................. 2005-356645

(51) Int. Cl.
*H01L 21/3205* (2006.01)
*H01L 21/425* (2006.01)

(52) U.S. Cl. ................ 438/585; 438/530; 257/E21.177

(58) Field of Classification Search .......... 257/E21.176, 257/E21.177

See application file for complete search history.

(56) References Cited

U.S. PATENT DOCUMENTS

| 4,697,333 | A* | 10/1987 | Nakahara ..................... 438/301 |
| 6,596,605 | B2* | 7/2003 | Ha et al. ...................... 438/417 |
| 6,870,224 | B2* | 3/2005 | Kanda et al. ................. 257/345 |
| 2003/0047734 | A1* | 3/2003 | Fu et al. ......................... 257/64 |
| 2005/0236667 | A1* | 10/2005 | Goto et al. ................... 257/344 |

FOREIGN PATENT DOCUMENTS

JP    2004-356520    12/2004

* cited by examiner

*Primary Examiner*—Scott B. Geyer
*Assistant Examiner*—Mohsen Ahmadi
(74) *Attorney, Agent, or Firm*—McGinn IP Law Group, PLLC

(57) ABSTRACT

In a semiconductor device including a semiconductor substrate, and an n-channel type MOS transistor produced in the semiconductor substrate, the n-channel type MOS transistor includes a gate insulating layer formed on the semiconductor substrate and having a thickness of at most 1.6 nm, and a gate electrode layer on the gate insulating layer, and the gate electrode layer is composed of polycrystalline silicon which has an average grain size falling within a range between 10 nm and 150 nm in the vicinity of the gate insulating layer.

5 Claims, 22 Drawing Sheets

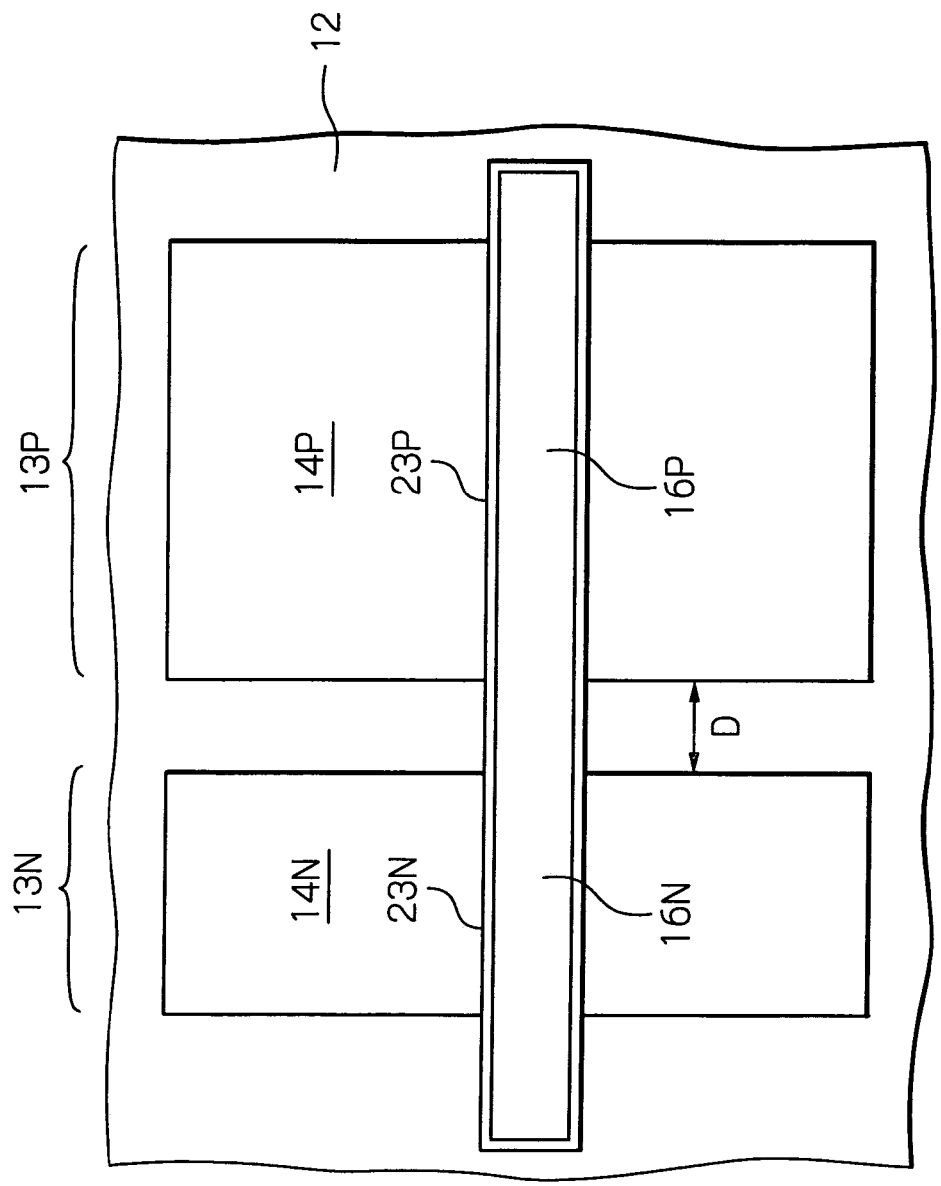

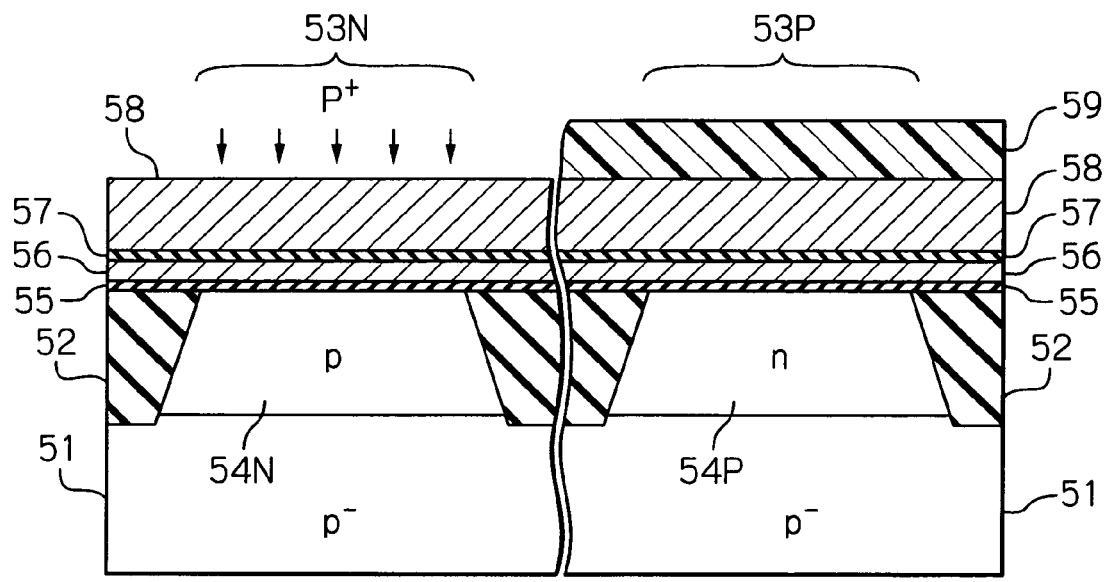
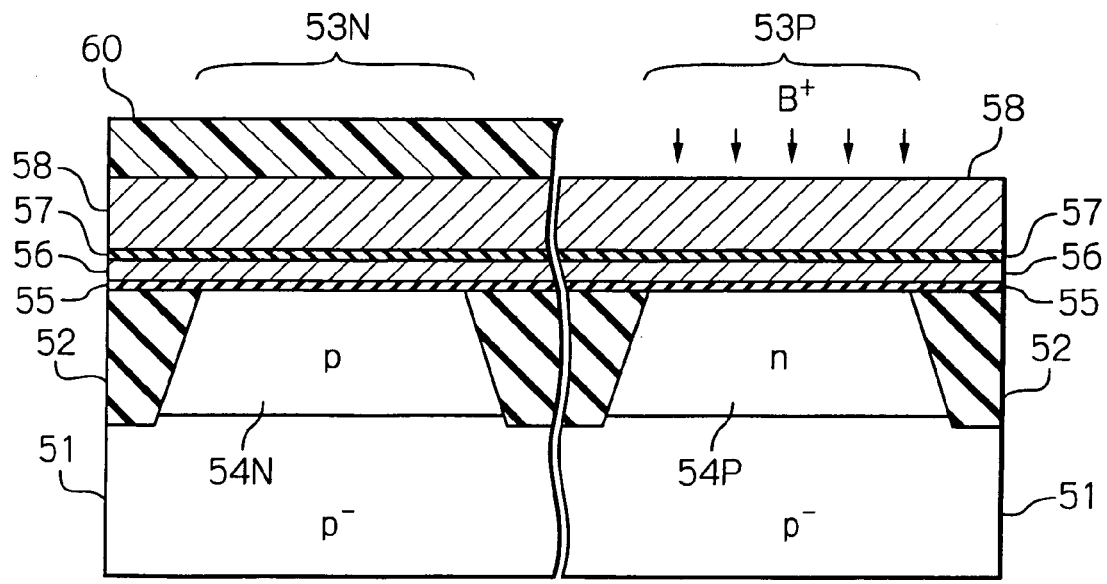

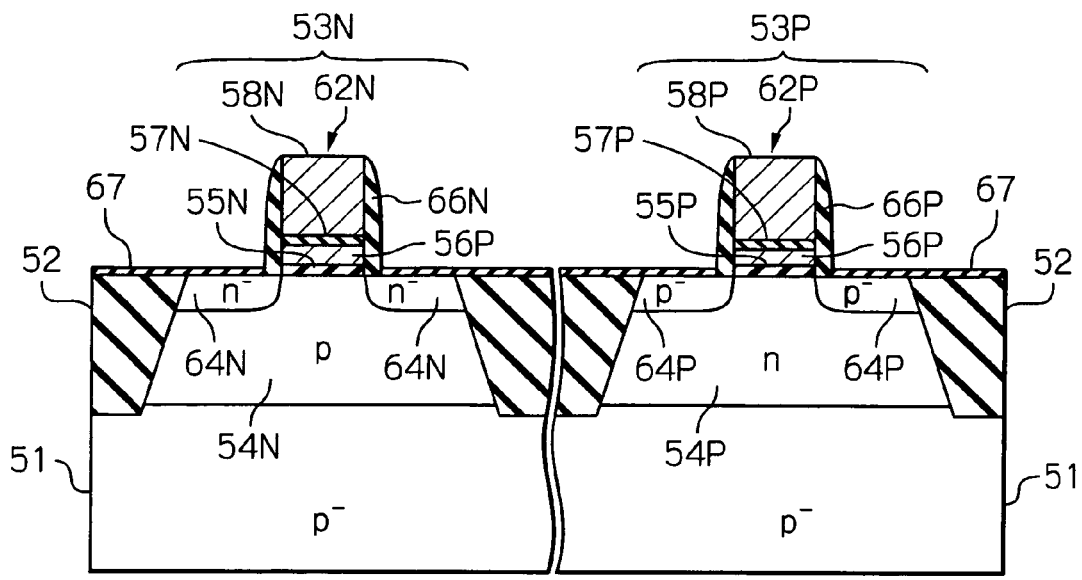
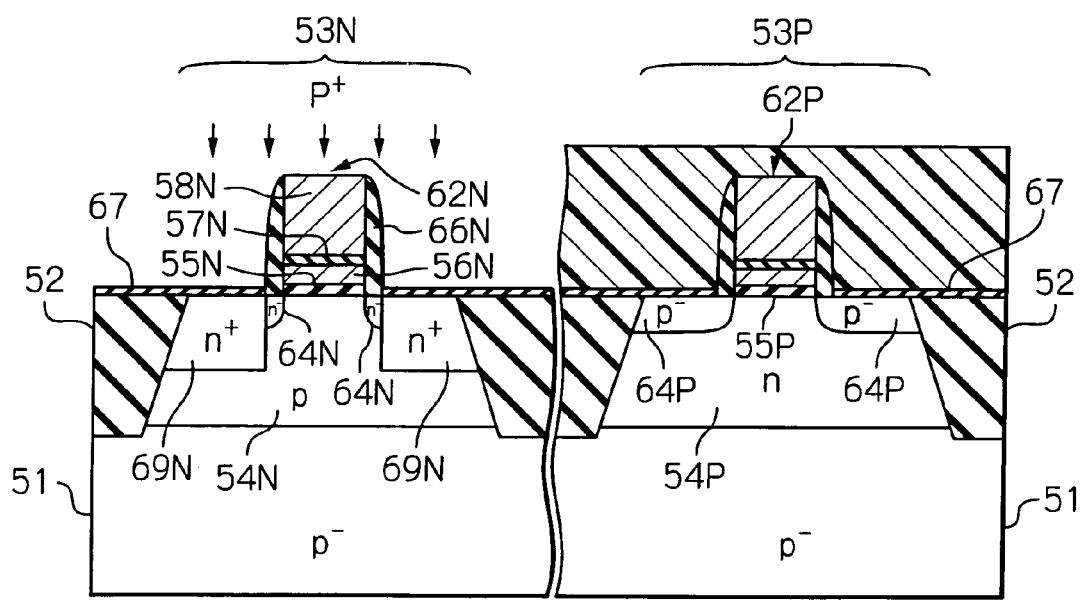

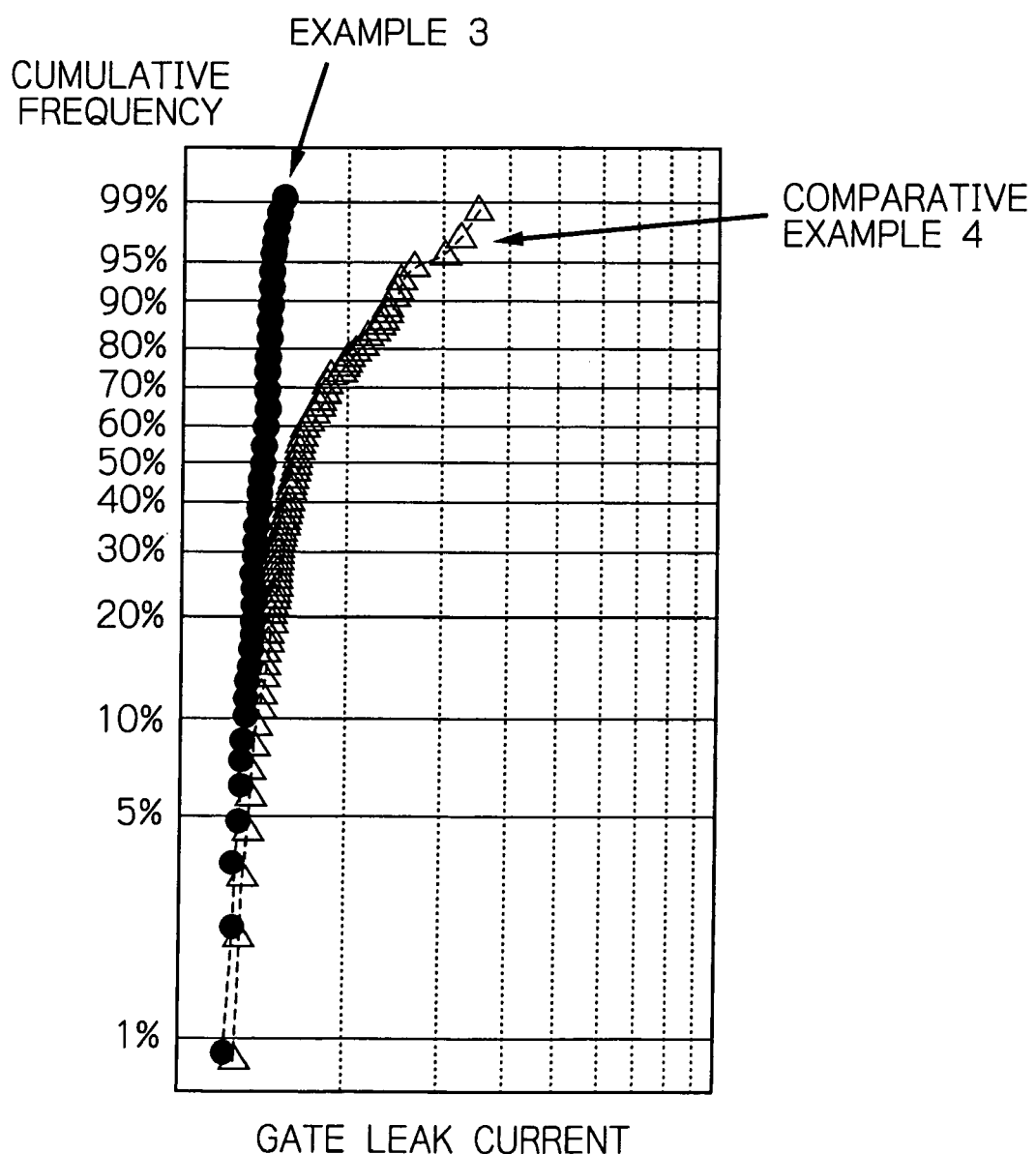

US 7,442,632 B2

SEMICONDUCTOR DEVICE N-CHANNEL TYPE MOS TRANSISTOR WITH GATE ELECTRODE LAYER FEATURING SMALL AVERAGE POLYCRYSTALLINE SILICON GRAIN SIZE

BACKGROUND OF THE INVENTION

1. Field of the Invention

The present invention relates to a semiconductor device including an n-channel type metal oxide semiconductor (MOS) transistor, and relates to a method for manufacturing such a semiconductor device.

2. Description of the Related Art

An n-channel type MOS transistor is included in various semiconductor devices. With the recent advance of miniaturization of semiconductor devices, in the n-channel type MOS transistor, the size of a gate electrode layer has become smaller, and the thickness of a gate insulating layer has become smaller, as disclosed in, for example, JP-2004-356520 A.

SUMMARY OF THE INVENTION

It has now been discovered that the above-mentioned prior art semiconductor device has a problem to be solved as mentioned hereinbelow.

In an n-channel type MOS transistor, when the gate insulating layer has a thickness of less than 1.6 nm, not only does a breakdown characteristic of the gate insulating layer considerably deteriorate, but also a sufficient ON-current between the source and the drain cannot be obtained, as discussed in detail hereinafter.

In accordance with a first aspect of the present invention, there is provided a semiconductor device comprising a semiconductor substrate, and an n-channel type MOS transistor produced in the semiconductor substrate. The MOS transistor includes a gate insulating layer formed on the semiconductor substrate and having a thickness of at most 1.6 nm, and a gate electrode layer on the gate insulating layer, and the gate electrode layer is composed of polycrystalline silicon which has an average grain size that falls within a range between 10 nm and 150 nm in the vicinity of the gate insulating layer.

The MOS transistor may be an n-channel type MOS transistor. In this case, the semiconductor device may further comprise include a p-channel type MOS transistor produced in the semiconductor substrate, wherein the p-channel type MOS transistor includes a gate insulating layer formed on the semiconductor substrate and having the same thickness as that of the gate insulating layer of the n-channel type MOS transistor, and a gate electrode layer on the gate insulating layer of the p-channel type MOS transistor and composed of polycrystalline silicon having an average grain size larger than that of the polycrystalline silicon of the gate electrode layer of the n-channel type MOS transistor.

In the first aspect of the present invention, the gate electrode layer of the MOS transistor main contain inert gas implanted thereinto at a given density so that the average grain size in the polycrystalline silicon of the gate electrode layer falls within the range between 10 nm and 150 nm, preferably the range between 50 nm and 100 nm. The given density of the inert gas may fall within a range between $2\times10^{21}$ cm$^{-3}$ and $1\times10^{22}$ cm$^{-3}$. The inert gas may comprise nitrogen gas.

When the MOS transistor is of the n-channel type, preferably, the gate electrode layer of the n-channel type MOS transistor contain inert gas implanted thereinto at a given density, and both the gate electrode layer of the n-channel type MOS transistor and the gate electrode layer of the p-channel type MOS transistor are integrated with each other to thereby establish an electrical connection therebetween.

In the first aspect of the present invention, the gate electrode layer of the MOS transistor may include a first polycrystalline silicon layer formed on the semiconductor substrate, a stopper layer formed on the first polycrystal line silicon layer, and a second polycrystalline layer formed on the stopper layer, the first polycrystalline silicon layer featuring the average grain size falling the range between 10 nm and 150 nm, preferably the range between 50 nm and 100 nm. In this case, the stopper layer may have a thickness falling within a range between 0.5 nm and 2 nm. Preferably, the stopper layer is formed as an insulating layer composed of one selected from the group consisting of silicon dioxide, silicon nitride and silicon carbide. Also, the first polycrystalline silicon layer may have a thickness falling within a range between 10 nm and 50 nm.

As stated hereinafter, in general, when a gate insulating layer has a thickness of less than 1.6 nm, a breakdown characteristic considerably deteriorates without regard to a gate length and a gate width.

Nevertheless, according to the first aspect of the present invention, since the polycrystalline silicon in the gate electrode layer has the average grain size falling within the range between 10 nm and 150 nm in the vicinity of the gate insulating layer, the characteristics of the MOS transistor is stabilized so that it is possible to obtain a reliable semiconductor device. Also, the deterioration of the breakdown characteristic of the gate insulating layer can be prevented improved without regard to the gate length and the gate width, resulting in improvement of a freedom of design in a semiconductor device.

In accordance with a second aspect of the present invention, there is provided a method for manufacturing a semiconductor device, which comprises: preparing a semiconductor substrate; forming an insulating layer on the semiconductor device, the insulating layer having a thickness of at most 1.6 nm; forming a polycrystalline silicon layer on the insulating layer; implanting n-type impurities into the polycrystalline silicon layer; implanting inert gas molecules or atoms into the polycrystalline silicon layer; forming a gate electrode structure including a gate insulating layer derived from the insulating layer, and a gate electrode layer derived from the polycrystalline silicon layer; and subjecting the gate electrode structure to an annealing process so that the polycrystalline silicon in the gate electrode layer has an average grain size falls within a range between 10 nm and 150 nm.

In the second aspect of the present invention, the inert gas implantation maybe carried out at a density falling within a range between $2\times10^{15}$ cm$^{-2}$ and $1\times10^{16}$ cm$^{-2}$.

In accordance with a third aspect of the present invention, there is provided a method for manufacturing a semiconductor device, which comprises: preparing a semiconductor substrate; forming a first insulating layer on the semiconductor device, the insulating layer having a thickness of at most 1.6 nm; forming a first polycrystalline silicon layer on the insulating layer; forming a second insulating layer on the first polycrystalline silicon layer; forming a second polycrystalline silicon layer on the second insulating layer; implanting n-type impurities into the first and second polycrystalline silicon layers; implanting inert gas molecules or atoms into the first and second polycrystalline silicon layers; forming a gate electrode structure including a gate insulating layer derived from the first insulating layer, a first gate electrode layer derived from the first polycrystalline silicon layer, a stopper layer derived from the second insulating layer, and a second gate electrode layer derived from the second polycrystalline silicon layer; and subjecting the gate electrode structure to an annealing process so that the polycrystalline silicon in the first gate electrode layer has an average grain size falls within a range between 10 nm and 150 nm.

In the third aspect of the present invention, the second insulating layer may be composed of one selected from the group consisting of silicon dioxide, silicon nitride and silicon carbide. Also, the first polycrystalline silicon layer has a thickness falling within a range between 10 nm and 50 nm.

According to the second and third aspects of the present invention, since the gate electrode structure features the average grain size falling within the range between 10 nm and 150 nm in the vicinity of the gate insulating layer, the characteristics of the MOS transistor is stabilized so that it is possible to obtain a reliable semiconductor device.

BRIEF DESCRIPTION OF THE DRAWINGS

The present invention will be more clearly understood from the description set forth below, as compared with the prior art semiconductor device, with reference to the accompanying drawings, wherein:

FIG. 6 is a plan view of a modification of the semiconductor device of FIG. 4L;

FIGS. 7A to 7L are partial cross-sectional views for explaining a second embodiment of the method for manufacturing a semiconductor device featuring an n-channel type MOS transistor and a p-channel type MOS transistor according to the present invention;

FIG. 12 is another graph showing a relationship between a cumulative frequency and a gate leak current in an n-channel type MOS transistor.

DESCRIPTION OF THE PREFERRED EMBODIMENTS

Before description of embodiments of the present invention, for better understanding of the present invention, a prior art semiconductor device will be explained below with reference to FIG. 1.

Figure 1:
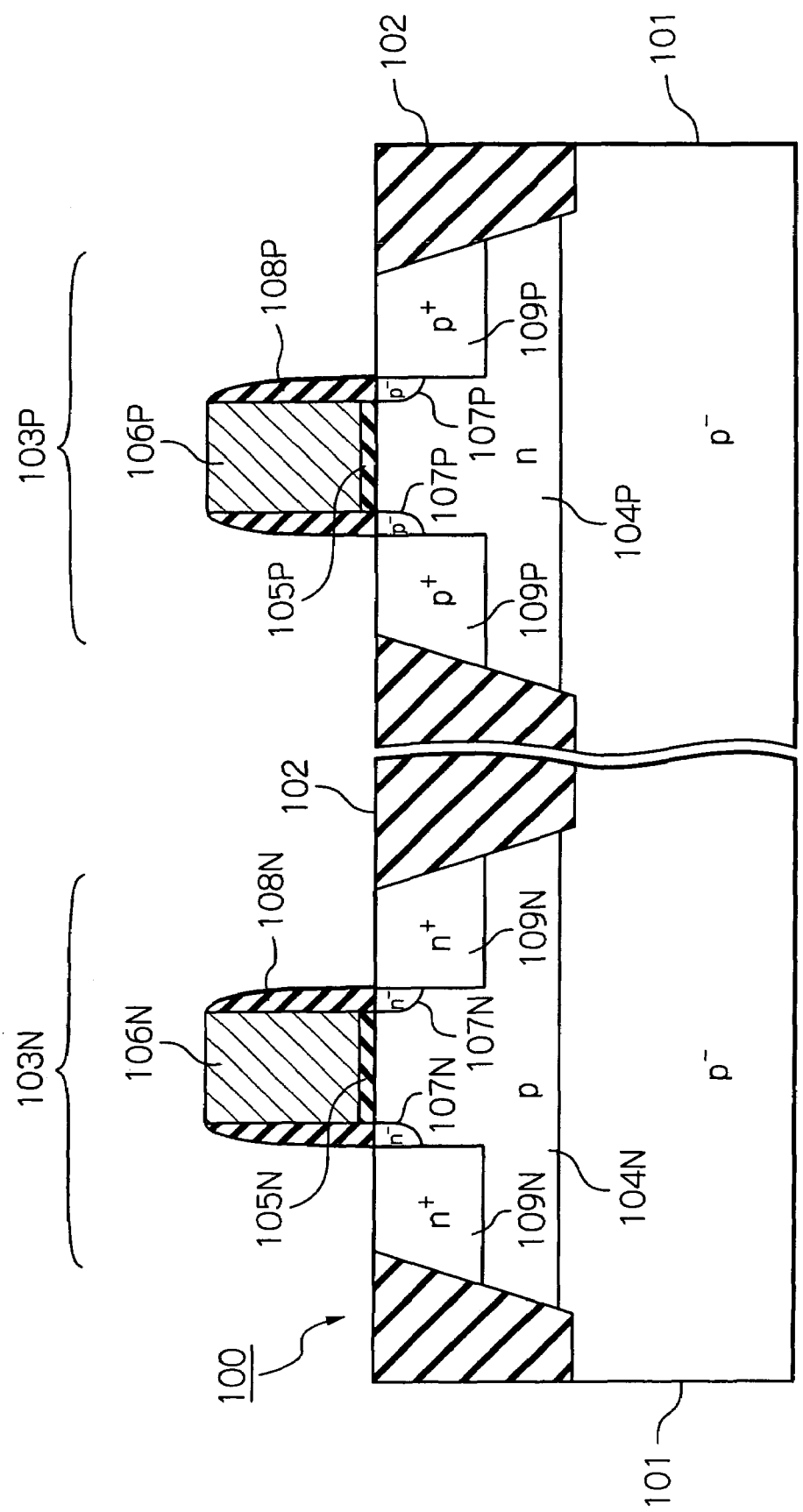
FIG. 1 is a partial cross-sectional view of a prior art semiconductor device featuring an n-channel type MOS transistor and a p-channel type MOS transistor.

Referring to FIG. 1 which is a partial cross-sectional view of a prior semiconductor device, as disclosed in JP-2004-356520 A, the prior semiconductor device is generally indicated by reference numeral 100, and includes a p⁻-type silicon substrate 101 which is derived from a monocrystalline silicon wafer.

A plurality of element-isolation layers 102 are formed in the p⁻-type silicon substrate 101 by using a shallow-trench isolation (STI). process, so that a plurality of n-channel type MOS transistor-formation areas 103N and a plurality of p-channel type MOS transistor-formation areas 103P are defined on the p⁻-type silicon substrate 101.

Note, in FIG. 1, only one of the n-channel type MOS transistor-formation areas 103N and only one of the p-channel type MOS transistor formation areas 103P are representatively illustrated.

A p-type well region 104N is formed in the p⁻-type silicon substrate 101 at the n-channel type MOS transistor-formation area 103N, and an n-type well region 104P is formed in the p⁻-type silicon substrate 101 at the p-channel type MOS transistor-formation area 103P.

Respective silicon dioxide layers 105N and 105P are formed as gate insulating layers on the transistor-formation areas 103N and 103P, and respective polycrystalline silicon layers 106N and 106P are formed as gate electrode layers on the gate insulating layers 105N and 105P.

A pair of n⁻-type source/drain regions 107N are formed in the p-type well region 104N at the n-channel type MOS transistor-formation area 103N, and a pair of p⁻-type source/drain regions 107P are formed in the n-type well region 104P at the p-channel type MOS transistor-formation area 103P.

Respective sidewalls 108N and 108P are formed as silicon dioxide walls along outer peripheral side fades of the gate electrode layers 106N and 106P with the gate insulating layers 105N and 105P.

A pair of n⁺-type source/drain regions 109N are formed in the p-type well region 104N at the n-channel type transistor-formation area 103N, and a pair of p⁺-type source/drain regions 109P are formed in the n-type well region 104P at the p-channel type transistor-formation area 103P, resulting in the formation of the n-channel type MOS transistor and the p-channel type MOS transistor in the transistor-formation areas 103N and 103P, respectively.

Incidentally, with the recent further advance of miniaturization of semiconductor devices, the size of the gate electrode layers has become smaller, and the thickness of the gate insulating layers has become smaller.

According to the inventors' research, it has been found that a breakdown characteristic of the gate insulating layers abruptly deteriorates when the thickness of the gate insulating layers is less than 1.6 nm, as stated below.

Figure 2:
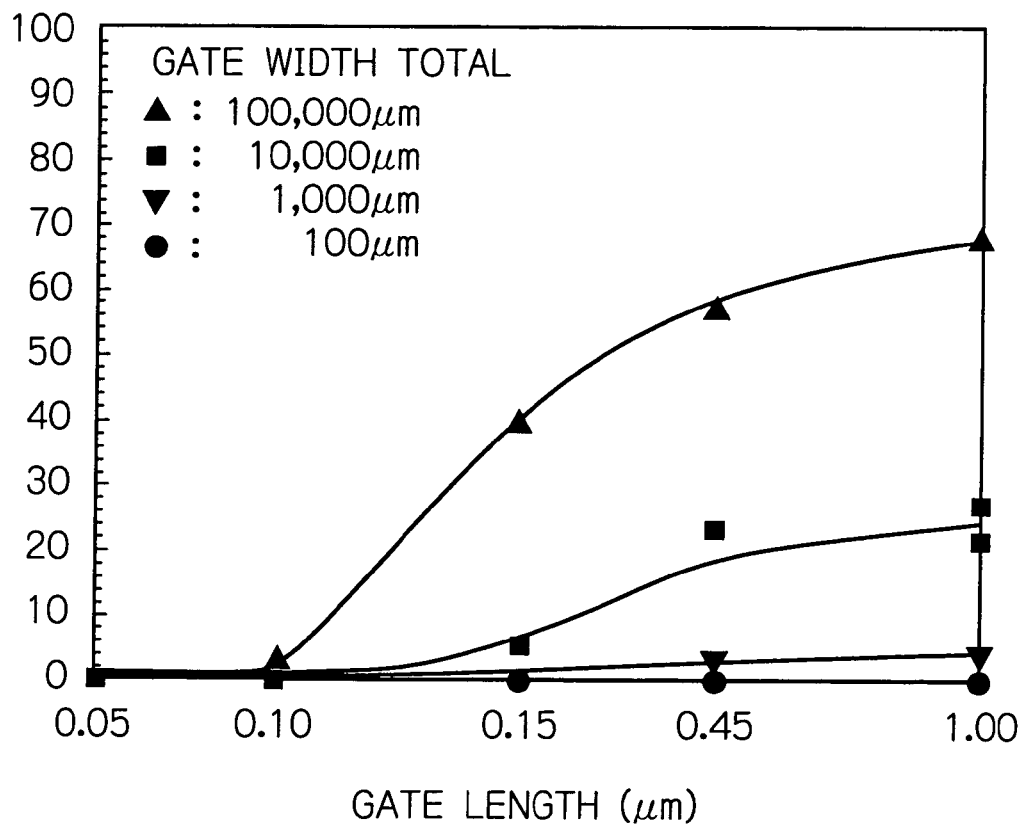
FIG. 2 is a graph for explaining a characteristic of the n-channel and p-channel types MOS transistors of FIG. 1.

As shown in a graph of FIG. 2 representing a relationship between the breakdown failure rate of the gate insulating layers having the thickness of 1.5 nm and both the gate length and the gate width total of the gate insulating layers, it is possible to suppress the breakdown failure rate to 0% when the gate length and the gate width total are less than 1.0 µm and 100 µm, respectively. Nevertheless, when the gate insulating layer is too thin in the n-channel type MOS transistors, it is impossible to suppress the breakdown failure rate even if the gate length and the gate width are less than 1.0 µm and 100 µm, respectively.

Note, in the graph of FIG. 2, the gate width total, indicated by each of symbols ▲, ■, ▼ and ●, represents the sum of the gate widths of the MOS transistors included in the corresponding semiconductor device.

Figure 3:
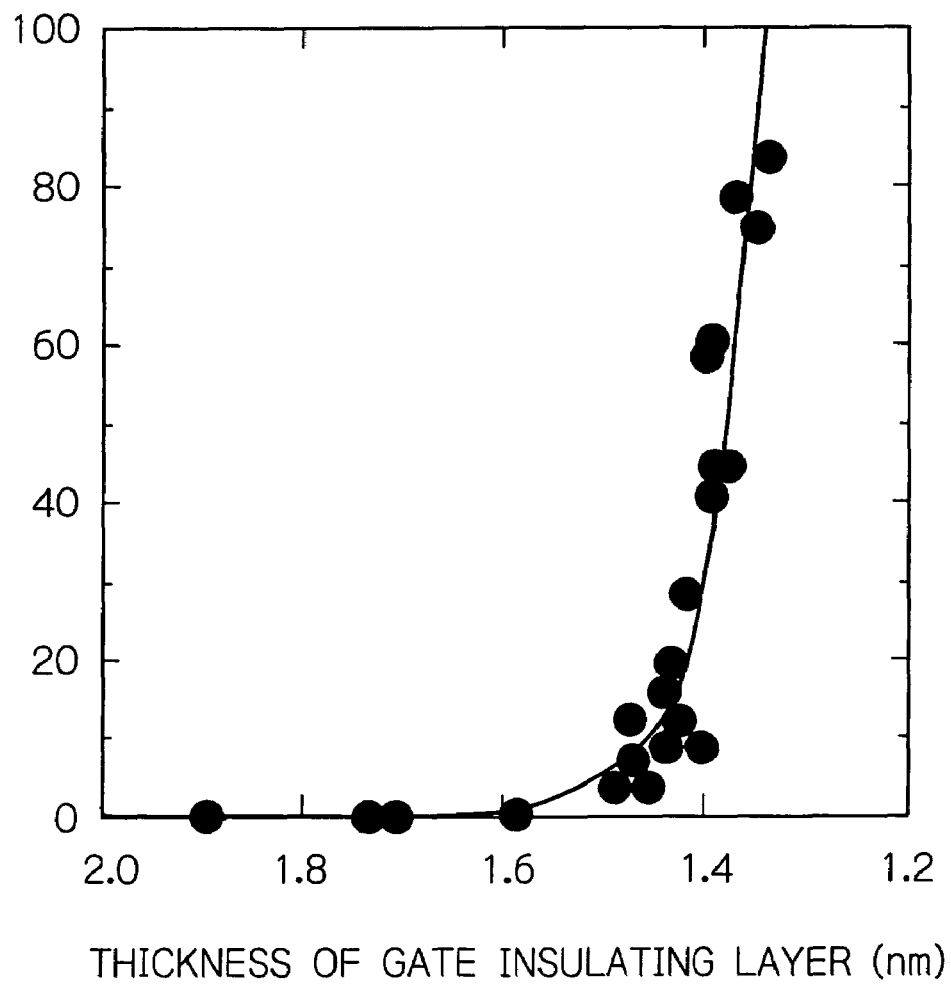
FIG. 3 is a graph for explaining a characteristic of the n-channel type MOS transistor of FIG. 1.

In particular, as shown in a graph of FIG. 3 representing a relationship between the breakdown failure rate of the gate insulating layers and the thickness of the gate insulating layers when the gate insulating layers have, for example, a gate length of 1 µm and a gate width of 1.0 mm, the breakdown failure rate of the gate insulating layers is abruptly increased when the thickness of the gate insulating layers is less than 1.6 nm.

Also, according to the inventors' research, it has been found that the increase of the breakdown failure rate in the n-channel type MOS transistors is derived from the fact that the grain size of the polycrystalline silicon layer or gate electrode layer formed on the gate insulating layer is too large, as discussed in detail hereinafter.

First Embodiment

With reference to FIGS. 4A to 4L, a first embodiment of the method for manufacturing a semiconductor device featuring an n-channel type MOS transistor and a p-channel type MOS transistor according to the present invention is explained below.

Figure 4A:
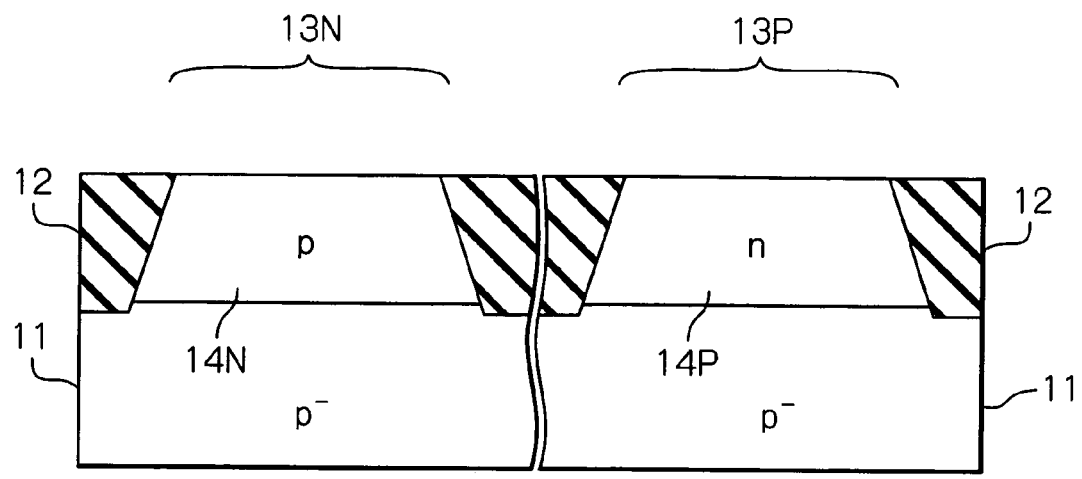
FIGS. 4A to 4L are partial cross-sectional views for explaining a first embodiment of the method for manufacturing a semiconductor device featuring an n-channel type MOS transistor and a p-channel type MOS transistor according to the present invention.

First, referring to FIG. 4A which is a partial cross-sectional view, a semiconductor substrate 11, for example, a p⁻-type silicon substrate which is derived from a monocrystalline silicon wafer, is prepared.

Then, a plurality of element-isolation layers 12 are formed in the p⁻-type silicon substrate 11 by using an STI (shallow-trench isolation) process, so that a plurality of n-channel type MOS transistor-formation areas 13N and a plurality of p-channel type MOS transistor-formation areas 13P are defined on the p⁻-type silicon substrate 11.

Note, in FIG. 4A, only one of the n-channel type MOS transistor-formation areas 13N and only one of the p-channel type MOS transistor formation areas 13P are representatively illustrated.

A p-type well region 14N is formed in the p⁻-type silicon substrate 11 at the n-channel type MOS transistor-formation area 13N by implanting p-type impurities such as boron ions ($B^+$) thereinto, and an n-type well region 14P is formed in the p⁻-type silicon substrate 11 at the p-channel type MOS transistor-formation area 13P by implanting n-type impurities such as phosphorus ions ($P^+$) or arsenic ions ($As^+$) thereinto.

Figure 4B:
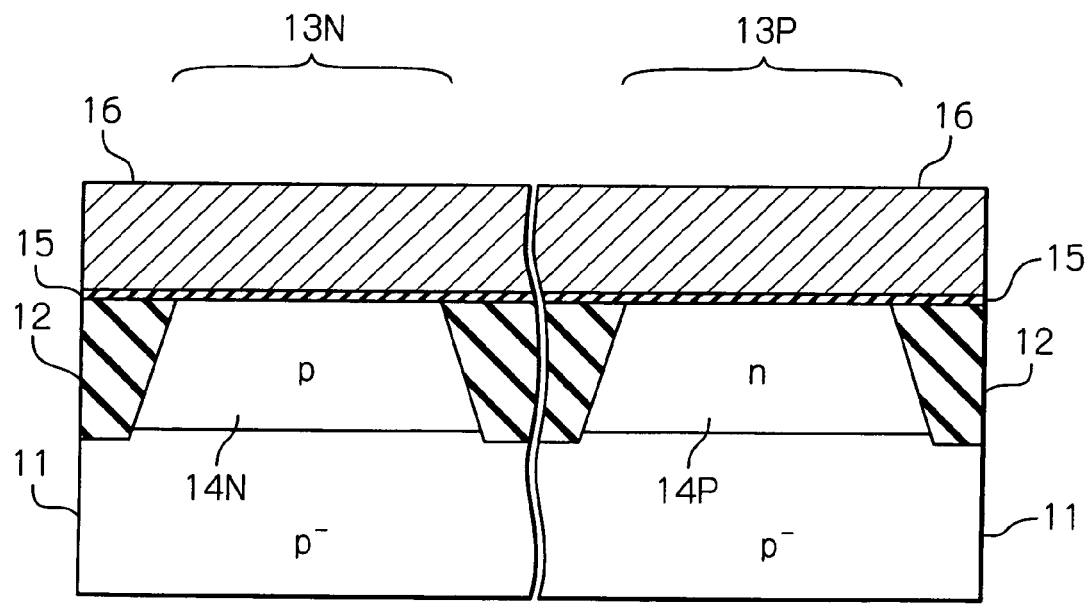

Next, referring to FIG. 4B which is a partial cross-sectional view, an insulating layer 15, for example, a silicon dioxide layer having a thickness of at most 1.6 nm, is formed over the surface of the p⁻-type silicon substrate 11 by using a thermal oxidization process, a sputtering process or an atomic layer deposition (ALD) process, and then a polycrystalline silicon layer 16 is formed over the silicon dioxide layer 15 by using a suitable chemical vapor deposition (CVD) process.

Note that another insulating layer, such as a silicon nitride layer, a suitable high-k layer or the like, may be substituted for the silicon dioxide layer 15.

Figure 4C:
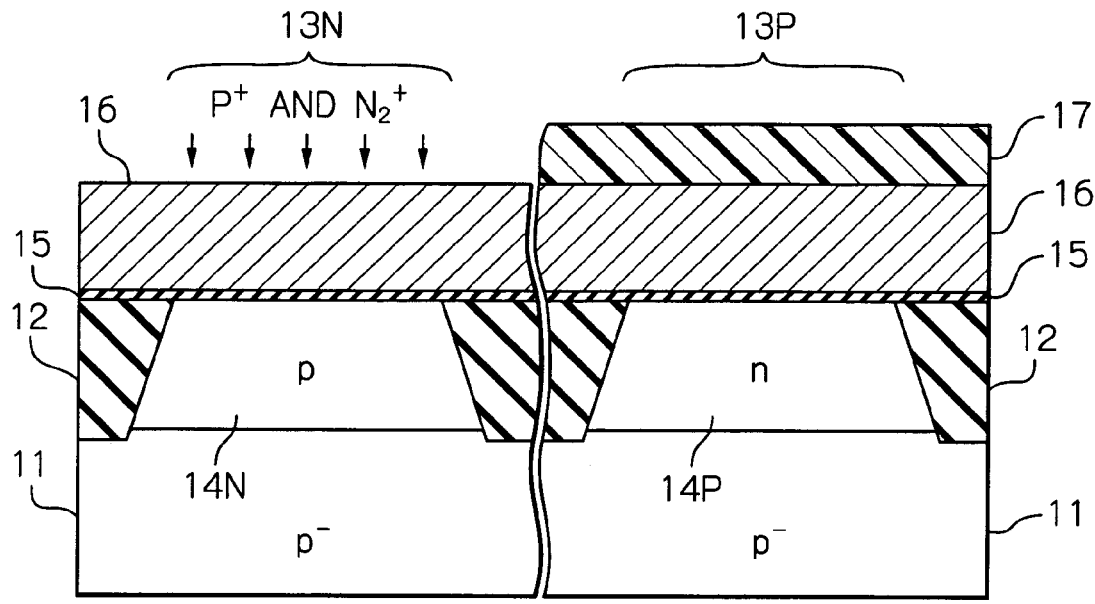

Next, referring to FIG. 4C which is a partial cross-sectional view, a photoresist layer is formed over the polycrystalline silicon layer 16, and is patterned by using a photolithography process to thereby produce a photoresist pattern layer 17, with which only the p-channel type MOS transistor-formation area 13P is masked.

Then, n-type impurities such as phosphorus ions ($P^+$) or arsenic ions ($As^+$) are implanted into the polycrystalline silicon layer 16 at the n-channel type MOS transistor-formation area 13N at a density falling within a range between $2E15$ $cm^{-2}$ and $1E16$ $cm^{-2}$, as conceptually shown by arrows in FIG. 4C, to thereby diminish an electrical resistance of the polycrystalline silicon layer 16 at the n-channel type MOS transistor-formation area 13N. Subsequently, inert gas ions such as nitrogen gas ions ($N_2^+$), argon gas ions ($Ar^+$), helium gas ions ($He^+$) or the like are implanted into the polycrystalline silicon layer 16 at the n-channel type MOS transistor-formation area 13N at a density falling within a range between $2E15$ $cm^{-2}$ and $1E16$ $cm^{-2}$.

Note, although the inert-gas implantation may be carried out with only one kind of inert gas ($N_2$, Ar or He), it is possible to use an inert gas mixture which is composed of more than one kind of inert gas.

After the inert-gas implantation is completed, the photoresist pattern layer 17 is removed from the polycrystalline silicon layer 16.

Figure 4D:
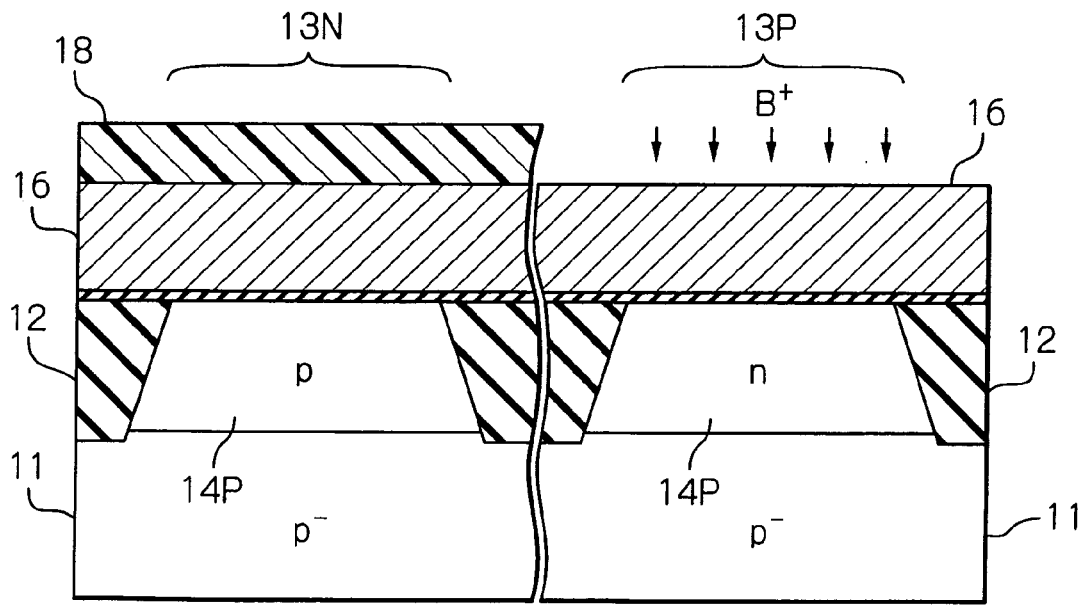

Next, referring to FIG. 4D which is a partial cross-sectional view, a photoresist layer is formed over the polycrystalline silicon layer 16, and is patterned by using a photolithography process to thereby produce a photoresist pattern layer 18, with which only the n-channel type MOS transistor-formation area 13N is masked.

Then, p-type impurities such as boron ions ($B^+$) are implanted into the polycrystalline silicon layer 16 at the p-channel type MOS transistor-formation area 13P, as conceptually shown by arrows in FIG. 4D, so that a density of the implanted p-type impurities falls within a range between $2E15$ $cm^{-2}$ and $1E16$ $cm^{-2}$, to thereby diminish an electrical resistance of the polycrystalline silicon layer 16 at the p-channel type MOS transistor-formation area 13P.

After the p-type impurity implantation is completed, the photoresist pattern layer 18 is removed from the polycrystalline silicon layer 16.

Figure 4E:
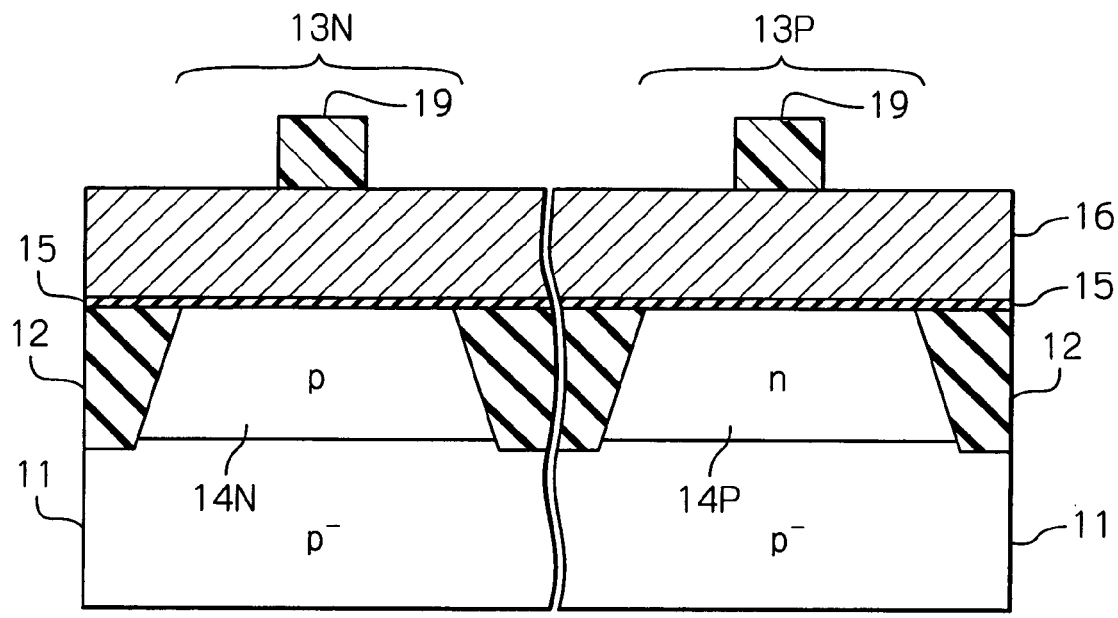

Next, referring to FIG. 4E which is a partial cross-sectional view, a photoresist layer is formed over the polycrystalline silicon layer 16, and is patterned by using a photolithography process to thereby produce photoresist pattern layers 19 which are used to form respective gate electrode layers at the n-channel and p-channel type MOS transistor-formation areas 13N and 13P.

Figure 4F:
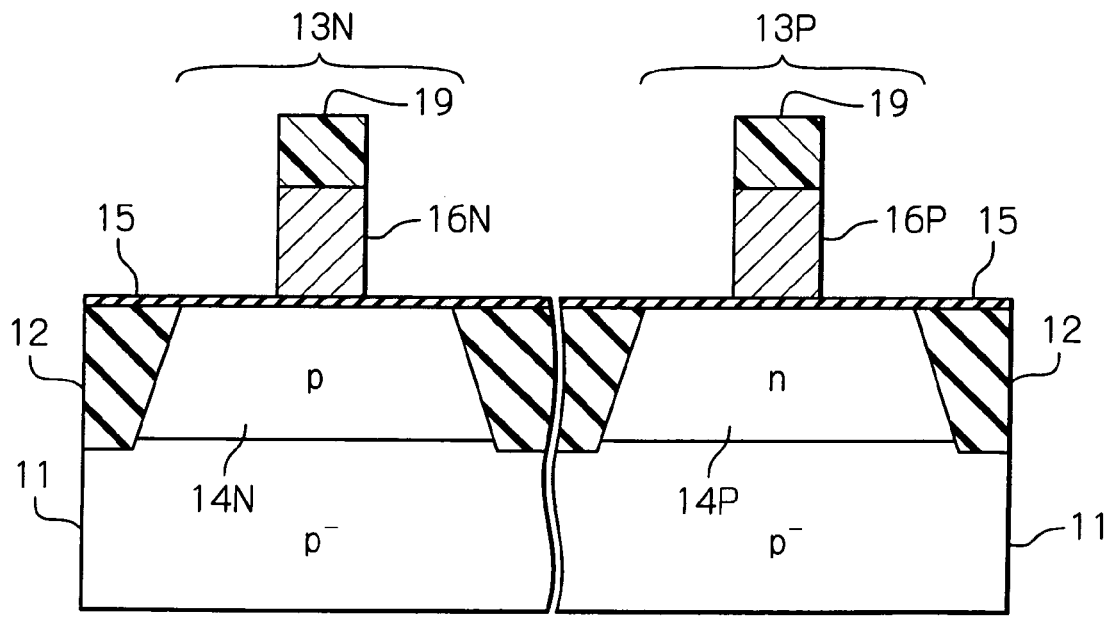

Next, referring to FIG. 4F which is a partial cross-sectional view, the polycrystalline silicon layer 16 is subjected to a dry etching process or anisotropic etching process so that respective gate electrode layers 16N and 16P are formed on the silicon dioxide layer 15. Then, the photoresist pattern layers 19 are removed from the gate electrode layers 16N and 16P.

Figure 4G:
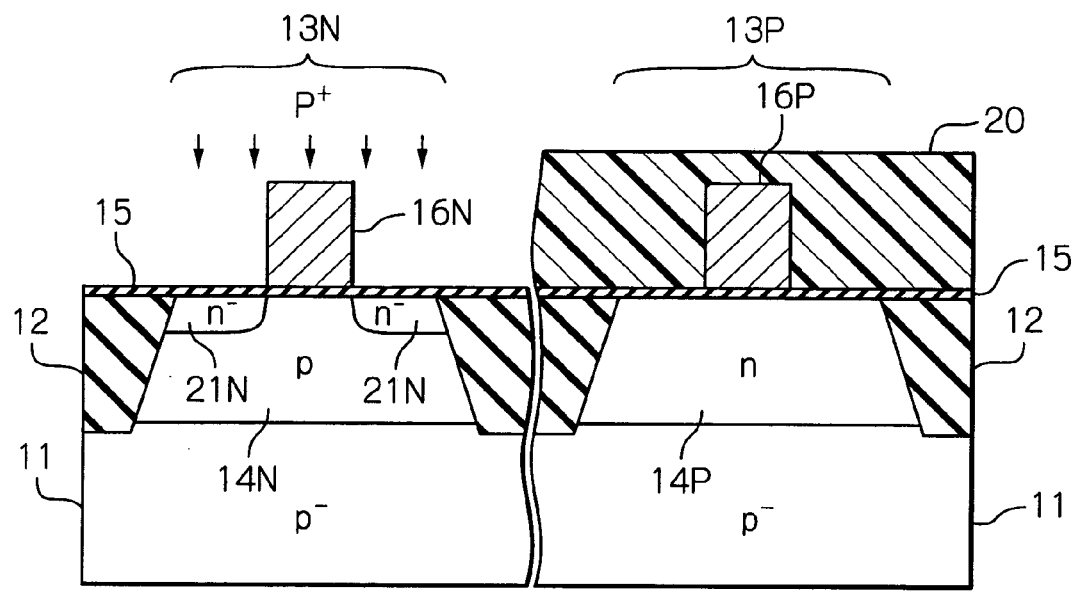

Next, referring to FIG. 4G which is a partial cross-sectional view, a photoresist layer is formed over the silicon dioxide layer 15 so that the gate electrode layers 16N and 16P are covered therewith, and is patterned by using a photolithography process to thereby produce a photoresist pattern layer 20, with which only the p-channel type MOS transistor-formation area 13P with the gate electrode layer 16P is masked. Then, n-type impurities such as phosphorus ions ($P^+$) or arsenic ions ($As^+$) are implanted into the p-type well region 14N, as conceptually shown by arrows in FIG. 4G, so that a pair of n⁻-type source/drain regions 21N are formed in the p-type well region 14N in self-alignment with the gate electrode layer 16N.

After the n-type impurity implantation is completed, the photoresist pattern layer 20 is removed from the silicon dioxide layer 15.

Figure 4H:
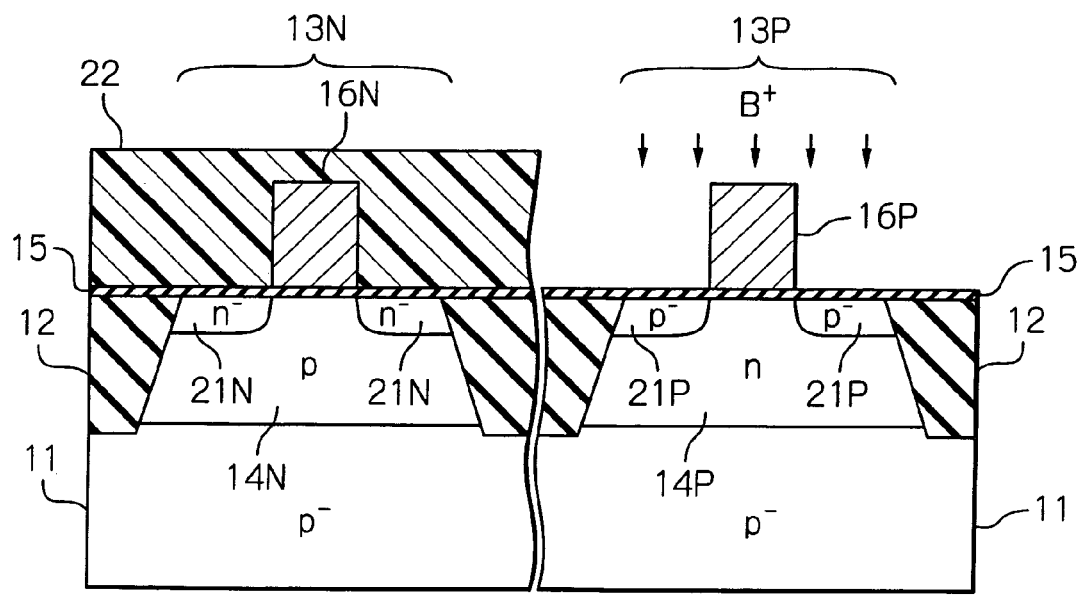

Next, referring to FIG. 4H which is a partial cross-sectional view, a photoresist layer is formed over the silicon dioxide layer 15 so that the gate electrode layers 16N and 16P are covered therewith, and is patterned by using a photolithography process to thereby produce a photoresist pattern layer 22, with which only the n-channel type MOS transistor-formation area 13N with the gate electrode layer 16N is masked. Then, p-type impurities such as boron ions ($B^+$) are implanted into the n-type well region 14P, as conceptually shown by arrows in FIG. 4H, so that a pair of $p^-$-type source/drain regions 21P are formed in the n-type well region 12P in self-alignment with the gate electrode layer 16P.

After the p-type impurity implantation is completed, the photoresist pattern layer 22 is removed from the silicon dioxide layer 15.

Figure 4I:
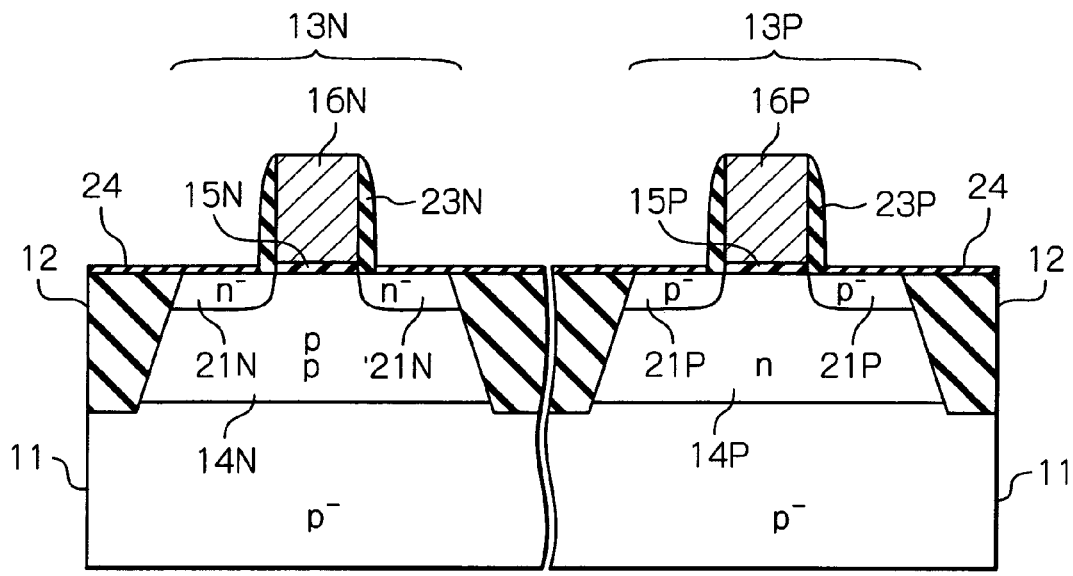

Next, referring to FIG. 4I which is a partial cross-sectional view, the silicon dioxide layer 15 is subjected to a dry etching process so that respective gate insulating layers 15N and 15P are formed beneath the gate electrode layers 16N and 16P. Then, a silicon dioxide layer is formed over the surface of the $p^-$-type silicon substrate 11 by using a suitable CVD process so that the gate electrode layers 16N and 16P are covered therewith, and is then etched back so that respective sidewalls 23N and 23P are formed along outer peripheral side faces of the gate electrode layers 16N and 16P with the gate insulating layers 15N and 15P.

After the formation of the sidewalls 23N and 23P is completed, a silicon dioxide layer 24 is formed over the surface of the $p^-$-type silicon substrate 11 by using a thermal oxidization process, a sputtering process or an atomic layer deposition (ALD) process.

Figure 4J:
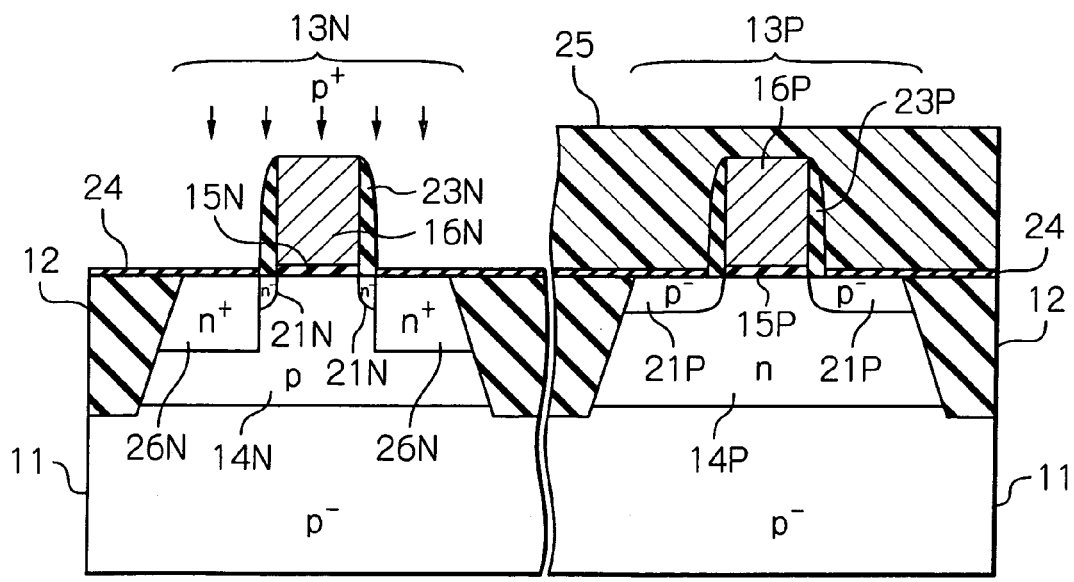

Next, referring to FIG. 4J which is a partial cross-sectional view, a photoresist layer is formed over the silicon dioxide layer 24 so that the gate electrode layers 16N and 16P are covered therewith, and is patterned by using a photolithography process to thereby produce a photoresist pattern layer 25, with which only the p-channel type MOS transistor-formation area 13P with the gate electrode layer 16P is masked. Then, n-type impurities such as phosphorus ions ($P^+$) or arsenic ions ($As^+$) are implanted into the p-type well region 14N, as conceptually shown by arrows in FIG. 4J, so that a pair of $n^+$-type source/drain regions 26N are formed in the p-type well region 14N in self-alignment with the sidewall 23N.

After the n-type impurity implantation is completed, the photoresist pattern layer 25 is removed from the silicon dioxide layer 24.

Figure 4K:
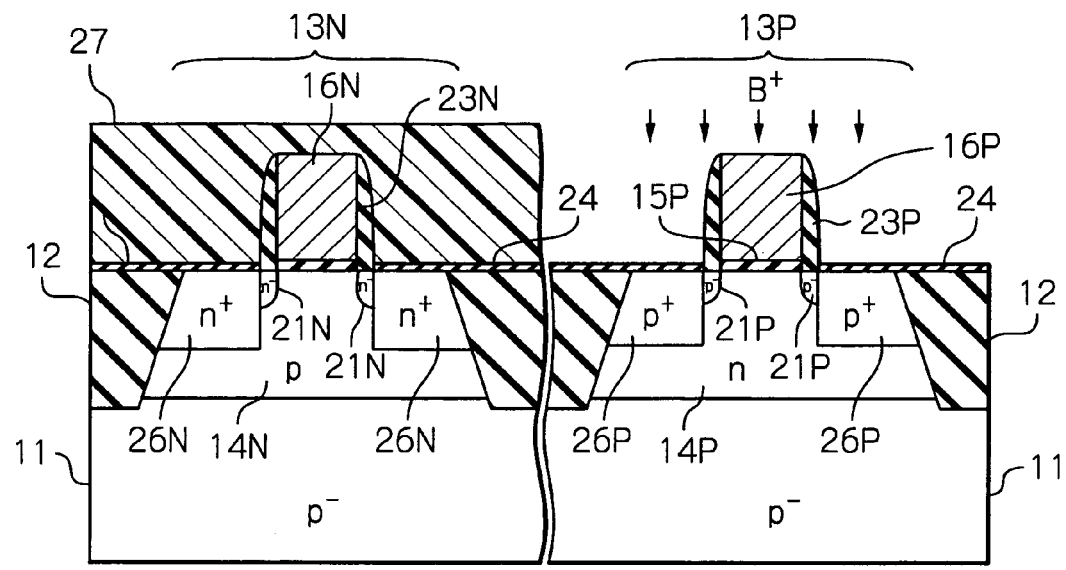

Next, referring to FIG. 4K which is a partial cross-sectional view, a photoresist layer is formed over the silicon dioxide layer 24 so that the gate electrode layers 16N and 16P are covered therewith, and is patterned by using a photolithography process to thereby produce a photoresist pattern layer 27, with which only the n-channel type MOS transistor-formation area 13N with the gate electrode layer 16N is masked. Then, p-type impurities such as boron ($B^+$) are implanted into the n-type well region 14P, as conceptually shown by arrows in FIG. 4K, so that a pair of $p^+$-type source/drain regions 26P are formed in the n-type well region 14P in self-alignment with the sidewall 23P.

After the p-type impurity implantation is completed, the photoresist pattern layer 27 is removed from the silicon dioxide layer 24, and then the silicon dioxide layer 24 is removed from the surface of the $p^-$-type silicon substrate 11.

Figure 4L:
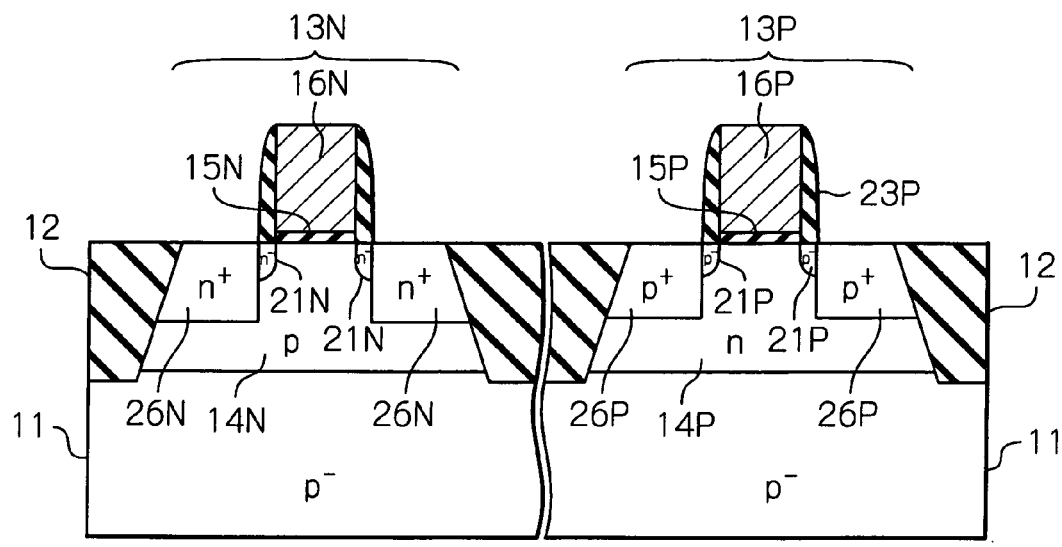

Next, referring to FIG. 4L which is a partial cross-sectional view, the $p^-$-type silicon substrate 11 with the gate electrode layers 16N and 16P is subjected to an annealing process under a temperature falling with a range between 1,000° C. and 1,100° C., so that recrystallization is carried out in the $n^-$-type source/drain regions 21N, the $n^+$-type source/drain regions 26N, the $p^-$-type source/drain regions 21P and the $p^+$-type source/drain regions 26P, resulting in production of the semiconductor device featuring the n-channel type MOS transistor and the p-channel type MOS transistor.

Note, for the annealing process, it is possible to utilize a rapid thermal anneal (ETA) process.

In the above-mentioned first embodiment, during the annealing process (FIG. 4L), the implanted inert gas molecules ($N_2$) or atoms (Ar or He) are activated and diffused in the polycrystalline silicon layer or gate electrode layer 16N. When the inert gas ions are implanted into the gate electrode layer 16N at the density of falling within the range between 2E15 $cm^{-2}$ and 1E16 $cm^{-2}$ (see: FIG. 4C), the diffused inert gas molecules ($N_2$) or atoms (Ar or He) have a density falling within between $2\times10^{21}$ $cm^{-3}$ and $2\times10^{22}$ $cm^{-3}$.

Note that it is possible to measure and confirm the density of the diffused inert gas molecules or atoms by using a secondary ion mass spectrometry method.

Also, during the annealing process (FIG. 4L), grains of the polycrystalline silicon in the gate electrode layer 16N gradually grow, but the growth of the grains is suppressed so that the polycrystalline silicon in the gate electrode layer 16N has an average grain size falling within a range between 10 nm and 150 nm, preferably 50 nm and 100 nm, due to the existence of the inert gas molecules ($N_2$) or atoms (Ar or He) in the gate electrode layer 16N at the density falling within the range between $2\times10^{21}$ $cm^{-3}$ and $2\times10^{22}$ $cm^3$.

Figure 5A:
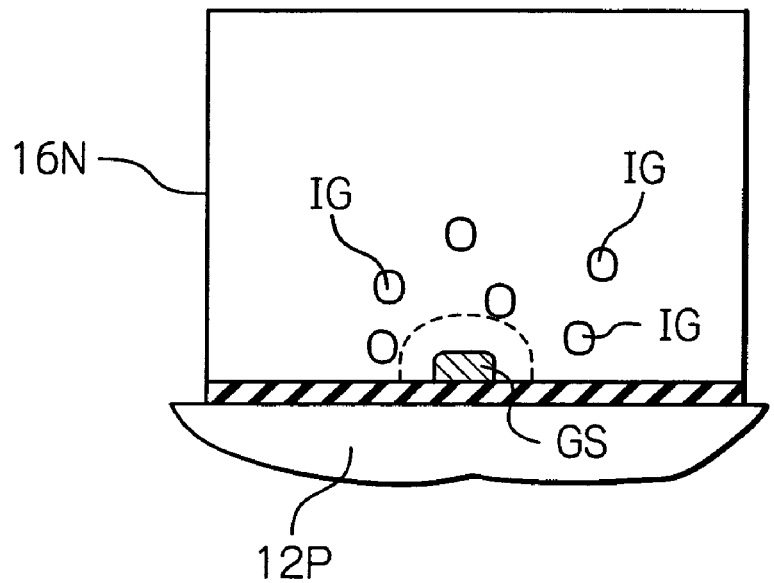
FIG. 5A is a conceptual cross-sectional view of a gate electrode layer of the n-channel type MOS transistor of FIG. 4L for explaining a growth of a grain of polycrystalline silicon in the gate electrode layer.

Although it is difficult to prove why the growth of the grains is suppressed due to the existence of the inert gas molecules ($N_2$) or atoms (Ar or He) in the gate electrode layer 16N, the reason may be presumed to be as follows:

Referring to FIG. 5A which is a conceptual cross-sectional view of the gate electrode layer 16N with the gate insulating layer 15N, reference IG indicates the inert gas molecules ($N_2$) or atoms (Ar or He), and reference GS indicates a grain seed of the polycrystalline silicon in the gate electrode layer 16N. During the annealing process, the grain seed GS gradually grows, but the growth of the grain seed GS is prevented by the inert gas molecules or atoms IG diffused in the gate electrode layer 16N, as shown by a broken line in FIG. 5A. Namely, the grain seed GS cannot grow more than the grain size shown by the broken line of FIG. 5A.

Figure 5B:
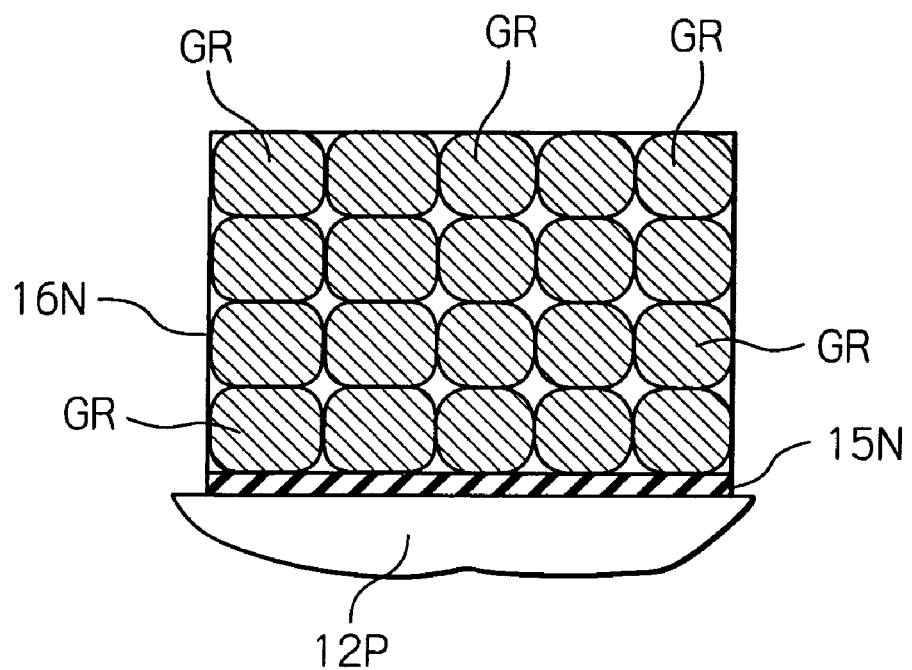
FIG. 5B is a conceptual cross-sectional view, similar to FIG. 5A, showing that the gate electrode layer is defined by the silicon grains.

Thus, as conceptually shown in FIG. 5B which is similar to FIG. 5A, the gate electrode layer 16N is defined by the grains GR having the average grain size falling within the range between 10 nm and 150 nm.

For example, the average grain size is defined as follows:

First, by observing a surface of the gate electrode layer 16N with a transmission electron microscopy (TEM), a predetermined number (e.g. 20) of grains are selected, and areas of the selected grains are measured. Then, an average area of the selected grains is calculated, and a diameter of a circle having the average area is defined as the average grain size.

In the n-channel type MOS transistor which features the gate insulating layer 15N having the thickness of at most 1.6 nm, when the grains in the gate electrode layer 16N grow to the average grain size of more than 150 nm, an excess physical stress is exerted on the gate insulating layer 15N by the grown grains so that a breakdown characteristic of the gate insulating layer 15N deteriorates, resulting in instability of characteristics of the n-channel type MOS transistor.

However, when the grains in the gate electrode layer 16N have the average grain size falling within the range between 10 nm and 150 nm, not only can the breakdown characteristic of the gate insulating layer 15N be improved so that the characteristics of the n-channel type MOS transistor are stabilized, but it is possible to obtain a sufficient ON-current between the source (21N/26N) and the drain (21N/26N) of the n-channel type MOS transistor source/drain of the regions (see: FIG. 4L).

On the other hand, in the p-channel type MOS transistor which features the gate insulating layer 15P having the thickness of at most 1.6 nm, although the grains in the gate electrode layer 16P gradually grow during the annealing process (FIG. 4L), the average grain size cannot exceed 200 nm due to the fact that the p-type impurities such as boron (B) are smaller than the n-type impurities such as phosphorus (P) or arsenic (As). Namely, an excess physical stress cannot be exerted on the gate insulating layer 15N, and thus the gate insulating layer 15N cannot be subjected to the deterioration of the breakdown characteristic.

In the semiconductor device produced in accordance with the above-mentioned first embodiment, although the n-channel and p-channel type MOS transistors are spaced apart from each other, these transistors may be adjacent to each other.

FIG. 6 shows a modification of the semiconductor device of FIG. 4L, which is manufactured as a static random access memory (SRAM) device in accordance with the above-mentioned first embodiment. Note, FIG. 6 is a partial plan view showing the n-channel type MOS transistor-formation area 13N and the p-channel type MOS transistor-formation area 13P.

In the SRAM device, the n-channel type MOS transistor-formation area 13N and the p-channel type MOS transistor-formation area 13P are adjacent to each other, with a distance D between the p-type well region 14N and the n-type well region 14P being on the order of 20 nm. The gate electrode layers 16N and 16P are integrated with each other to establish an electrical connection therebetween, and the sidewalls 23N and 23P are also integrated with each other.

In general, the boron atoms (B) implanted into the gate electrode layer 16P are liable to be diffused into the gate electrode layer 16N because the boron atoms (B) are smaller than the n-type impurities such as phosphorus (P) or arsenic (As), so that a depletion region may be created in the gate electrode layer 16N.

Nevertheless, in the SRAM device manufactured in accordance with the above-mentioned first embodiment, the diffusion of the boron atoms (B) from the gate electrode layer 16P into the gate electrode 16N is prevented due to the implantation of the inert gas molecules ($N_2$) or atoms (Ar or He) into the gate electrode 16N (N), whereby it is possible to suppress the creation of the depletion in the gate electrode layer 16N. Namely, the above-mentioned first embodiment can be advantageously applied to the manufacture of the SRAM device.

Second Embodiment

With reference to FIGS. 7A to 7L, a second embodiment of the method for manufacturing a semiconductor device featuring an n-channel type MOS transistor and a p-channel type MOS transistor according to the present invention is explained below.

Figure 7A:
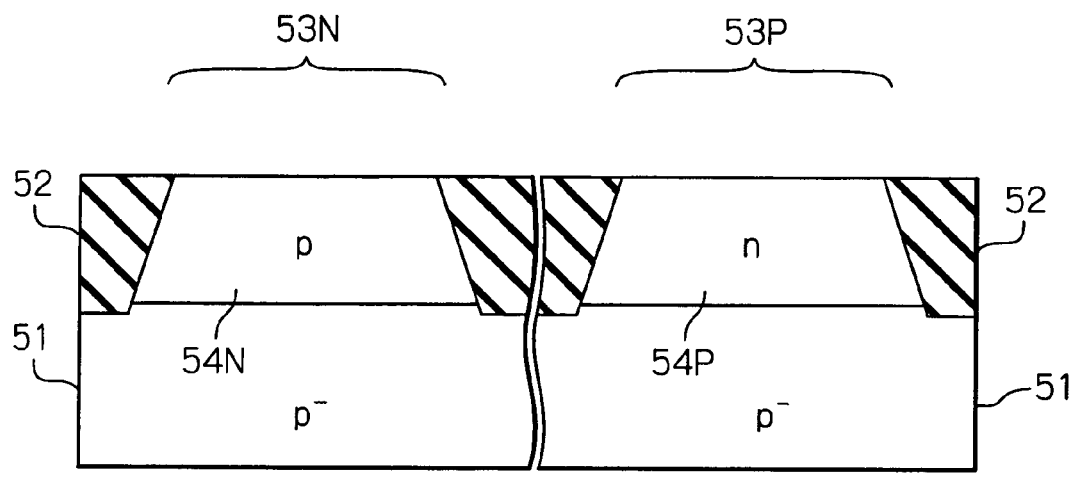

First, referring to FIG. 7A which is a partial cross-sectional view, a semiconductor substrate 51, for example, a p⁻-type silicon substrate which is derived from a monocrystalline silicon wafer, is prepared.

Then, a plurality of element-isolation layers 52 are formed in the p⁻-type silicon substrate 51 by using a shallow-trench isolation (STI) process, so that a plurality of n-channel type MOS transistor-formation areas 53N and a plurality of p-channel type MOS transistor-formation areas 53P are defined on the p⁻-type silicon substrate 51.

Note, in FIG. 7A, only one of the n-channel type MOS transistor-formation areas 53N and only one of the p-channel type MOS transistor formation areas 53P are representatively illustrated.

A p-type well region 53N is formed in the p⁻-type silicon substrate 51 at the n-channel type MOS transistor-formation area 53N by implanting p-type impurities such as boron ions ($B^+$) thereinto, and an n-type well region 53P is formed in the p⁻-type silicon substrate 51 at the p-channel type MOS transistor-formation area 53P by implanting n-type impurities such as phosphorus ions ($P^+$) or arsenic ions ($As^+$) thereinto.

Figure 7B:
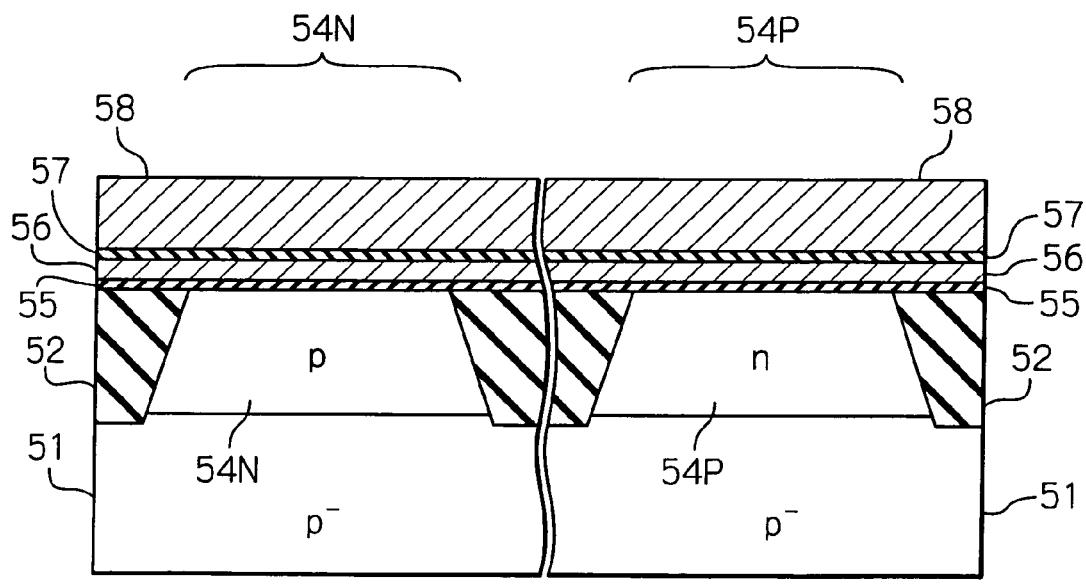

Next, referring to FIG. 7B which is a partial cross-sectional view, an insulating layer 55, for example, a silicon dioxide layer having a thickness of at most 1.6 nm, is formed over the surface of the p⁻-type silicon substrate 51 by using a thermal oxidization process, a sputtering process or an atomic layer deposition (ALD) process.

Note that another insulating layer, such as a silicon nitride layer, a suitable high-k layer or the like, may be substituted for the silicon dioxide layer 55.

Then, a polycrystalline silicon layer 56, which has a thickness falling within a range from 10 nm to 50 nm, is formed over the silicon dioxide layer 55, and a stopper layer 57, which has a thickness falling within a range from 0.5 nm to 2 nm, is formed over the polycrystalline silicon layer 56. The stopper layer 57 may be defined as a suitable insulating layer, such as a silicon dioxide layer, a silicon nitride layer, a silicon carbide layer or the like. Further, a polycrystalline silicon layer 58 is formed over the stopper layer 57. Note, the formation of the polycrystalline silicon layer 56, the stopper layer 57 and the polycrystalline silicon layer 58 can be continuously carried out with a single CVD process.

Next, referring to FIG. 7C which is a partial cross-sectional view, a photoresist layer is formed over the polycrystalline silicon layer 58, and is patterned by using a photolithography process to thereby produce a photoresist pattern layer 59, with which only the p-channel type MOS transistor-formation area 53P is masked.

Then, n-type impurities such as phosphorus ions ($P^+$) or arsenic ions ($As^+$) are implanted into the polycrystalline silicon layers 56 and 58 at the n-channel type MOS transistor-formation area 53N at a density falling within a range between $2E15$ cm$^{-2}$ and $1E16$ cm$^{-2}$, as conceptually shown by arrows in FIG. 7C, to thereby diminish an electrical resistance of the polycrystalline silicon layers 56 and 58 at the n-channel type transistor-formation area 53N.

After the n-type impurity implantation is completed, the photoresist pattern layer 59 is removed from the polycrystalline silicon layer 58.

Next, referring to FIG. 7D which is a partial cross-sectional view, a photoresist layer is formed over the polycrystalline silicon layer 58, and is patterned by using a photolithography process to thereby produce a photoresist pattern layer 60, with which only the n-channel type MOS transistor-formation area 53N is masked.

Then, p-type impurities such as boron ions ($B^+$) are implanted into the polycrystalline silicon layers 56 and 58 at the p-channel type MOS transistor-formation area 53P, as conceptually shown by arrows in FIG. 7D, so that a density of the implanted p-type impurities falls within a range between $2E15$ cm$^{-2}$ and $1E16$ cm$^{-2}$, to thereby diminish an electrical resistance of the polycrystalline silicon layers 56 and 58 at the p-channel type MOS transistor-formation area 53P.

After the p-type impurity implantation is completed, the photoresist pattern layer 60 is removed from the polycrystalline silicon layer 58.

Figure 7E:
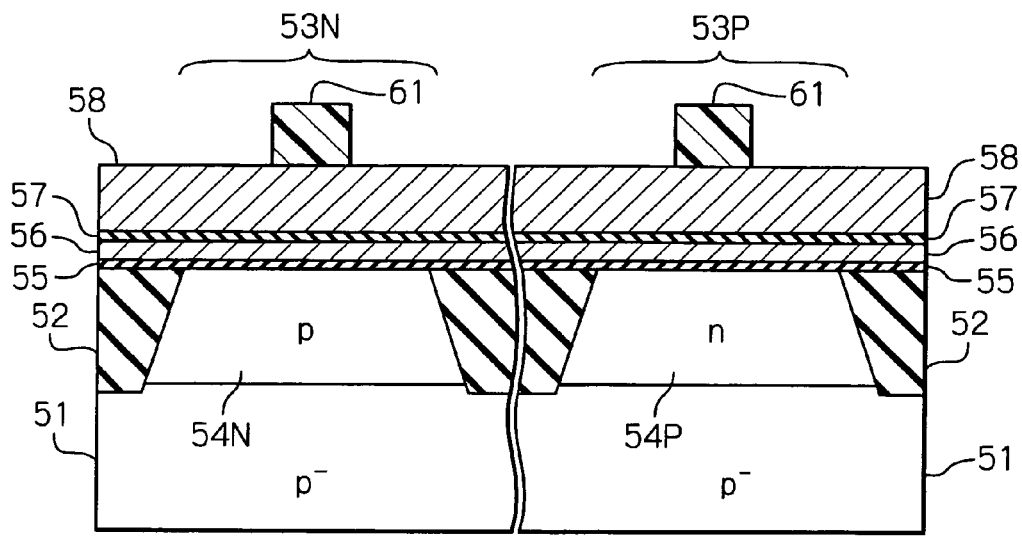

Next, referring to FIG. 7E which is a partial cross-sectional view, a photoresist layer is formed over the polycrystalline silicon layer 58, and is patterned by using a photolithography process to thereby produce photoresist pattern layers 61 which are used to form respective gate electrode layers at the n-channel and p-channel type MOS transistor-formation areas 53N and 53P.

Figure 7F:
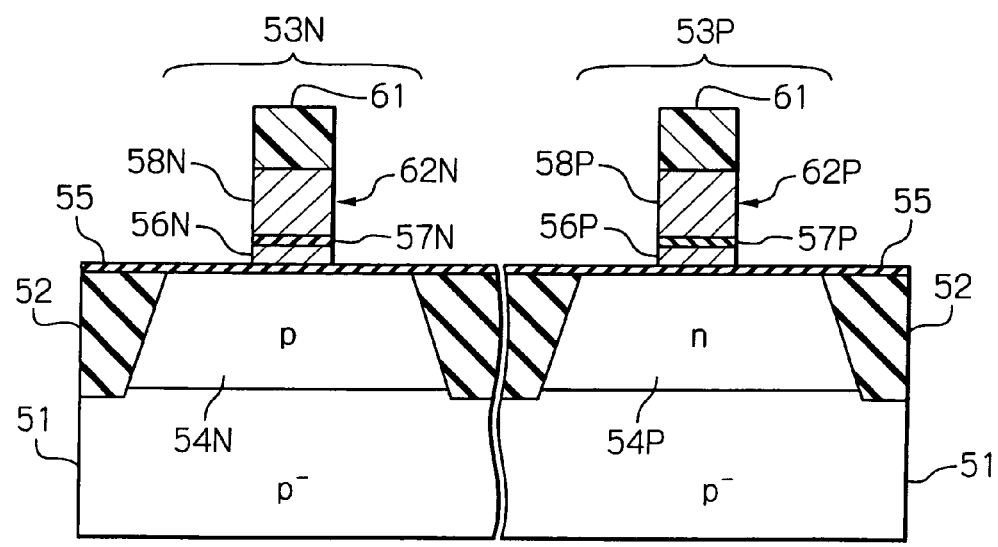

Next, referring to FIG. 7F which is a partial cross-sectional view, the polycrystalline silicon layer 56, the stopper layer 57 and the polycrystalline silicon layer 58 are subjected to a dry etching process or anisotropic etching process so that respective gate electrode structures 62N and 62P are formed on the silicon dioxide layer 55.

Namely, the gate electrode structure 62N is defined by a polycrystalline silicon layer section 56N derived from the polycrystalline silicon layer 56, a stopper layer section 57N derived from the stopper layer 57, and a polycrystalline silicon layer section 58N derived from the polycrystalline silicon layer 58.

Similarly, the gate electrode structure 62P is defined by a polycrystalline silicon layer section 56P derived from the polycrystalline silicon layer 56, a stopper layer section 57P derived from the stopper layer 57, and a polycrystalline silicon layer section 58P derived from the polycrystalline silicon layer 58.

After the formation of the gate electrode structures 62N and 62P is completed, the respective photoresist pattern layers 61 are removed from the gate electrode structures 62N and 62P.

Figure 7G:
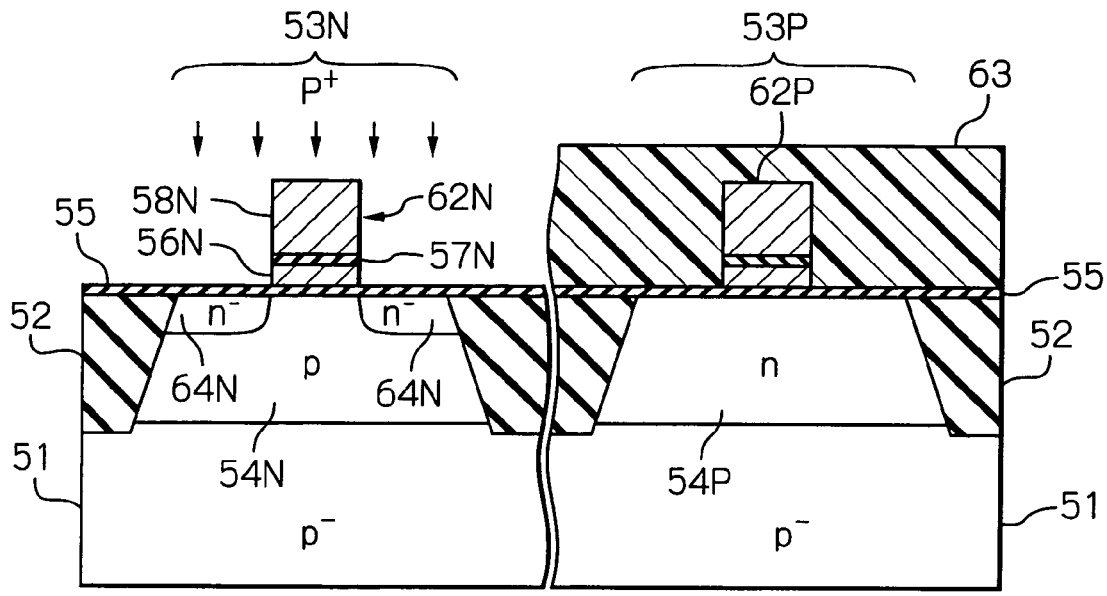

Next, referring to FIG. 7G which is a partial cross-sectional view, a photoresist layer is formed over the silicon dioxide layer 55 so that the gate electrode structures 62N and 62P are covered therewith, and is patterned by using a photolithography process to thereby produce a photoresist pattern layer 63, with which only the p-channel type MOS transistor-formation area 53P with the gate electrode structure 62P is masked. Then, n-type impurities such as phosphorus ions ($P^+$) or arsenic ions ($As^+$) are implanted into the p-type well region 54N, as conceptually shown by arrows in FIG. 7G, so that a pair of $n^-$-type source/drain regions 64N are formed in the p-type well region 54N in self-alignment with the gate electrode structure 62N.

After the n-type impurity implantation is completed, the photoresist pattern layer 63 is removed from the silicon dioxide layer 55.

Figure 7H:
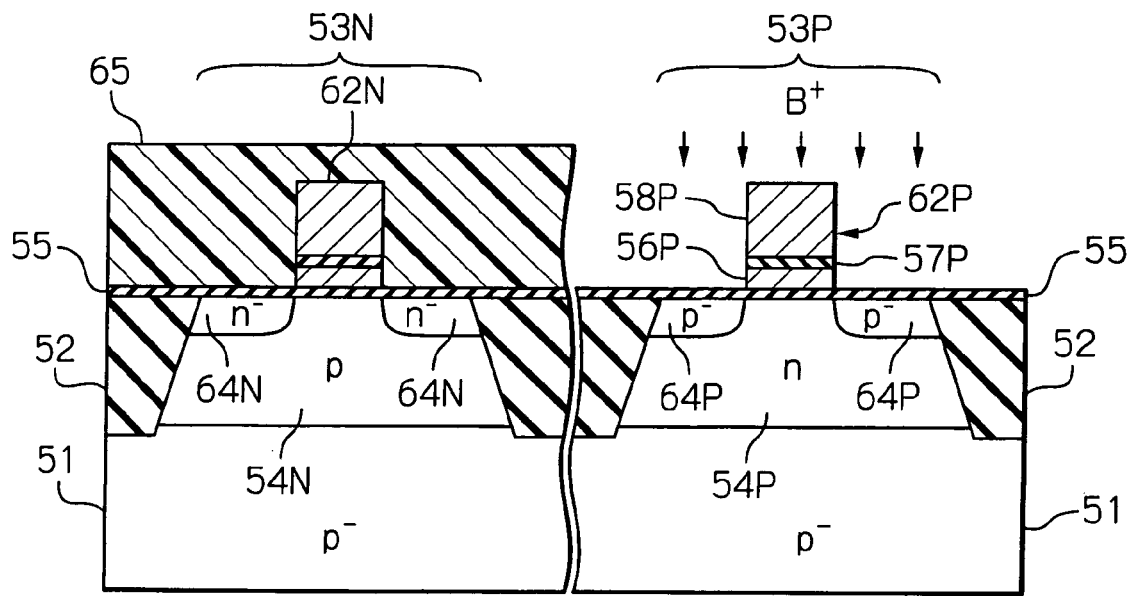

Next, referring to FIG. 7H which is a partial cross-sectional view, a photoresist layer is formed over the silicon dioxide layer 55 so that the gate electrode structures 62N and 62P are covered therewith, and is patterned by using a photolithography process to thereby produce a photoresist pattern layer 65, with which only the n-channel type MOS transistor-formation area 53N with the gate electrode structure 62N is masked. Then, p-type impurities such as boron ions ($B^+$) are implanted into the n-type well region 54P, as conceptually shown by arrows in FIG. 7H, so that a pair of $p^-$-type source/drain regions 64P are formed in the n-type well region 54P in self-alignment with the gate electrode structure 62P.

After the p-type impurity implantation is completed, the photoresist pattern layer 65 is removed from the silicon dioxide layer 55.

Next, referring to FIG. 7I which is a partial cross-sectional view, the silicon dioxide layer 55 is subjected to a dry etching process so that respective gate insulating layers 55N and 55P are formed beneath the gate electrode structures 62N and 62P. Then, a silicon dioxide layer is formed over the surface of the $p^-$-type silicon substrate 51 by using a suitable CVD process so that the gate electrode structures 62N and 62P are covered therewith, and is then etched back so that respective sidewalls 66N and 66P are formed along outer peripheral side faces of the gate electrode structures 62N and 62P with the gate insulating layers 55N and 55P.

After the formation of the sidewalls 66N and 66P is completed, a silicon dioxide layer 67 is formed over the surface of the $p^-$-type silicon substrate 51 by using a thermal oxidation process, a sputtering process or an atomic layer deposition (ALD) process.

Next, referring to FIG. 7J which is a partial cross-sectional view, a photoresist layer is formed over the silicon dioxide layer 67 so that the gate electrode structures 62N and 62P are covered therewith, and is patterned by using a photolithography process to thereby produce a photoresist pattern layer 68, with which only the p-channel type MOS transistor-formation area 53P with the gate electrode structure 62P is masked. Then, n-type impurities such as phosphorus ions ($P^+$) or arsenic ions ($As^+$) are implanted into the p-type well region 54N, as conceptually shown by arrows in FIG. 7J, so that a pair of $n^+$-type source/drain regions 69N are formed in the p-type well region 54N in self-alignment with the sidewall 66N.

After the n-type impurity implantation is completed, the photoresist pattern layer 68 is removed from the silicon dioxide layer 67.

Figure 7K:
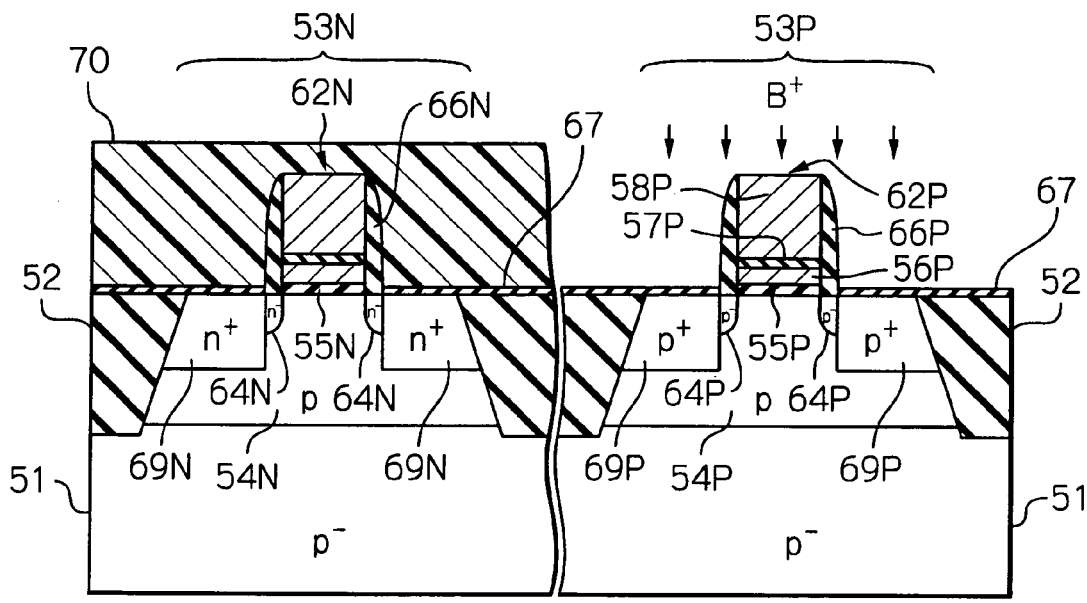

Next, referring to FIG. 7K which is a partial cross-sectional view, a photoresist layer is formed over the silicon dioxide layer 67 so that the gate electrode structures 62N and 62P are covered therewith, and is patterned by using a photolithography process to thereby produce a photoresist pattern layer 70, with which only the n-channel type MOS transistor-formation area 53N with the gate electrode structure 62N is masked. Then, p-type impurities such as boron ($B^+$) are implanted into the n-type well region 54P, as conceptually shown by arrows in FIG. 7K, so that a pair of $p^+$-type source/drain regions 69P are formed in the n-type well region 54P in self-alignment with the sidewall 66P.

After the p-type impurity implantation is completed, the photoresist pattern layer 70 is removed from the silicon dioxide layer 67, and then the silicon dioxide layer 67 is removed from the surface of the $p^-$-type silicon substrate 51.

Figure 7L:
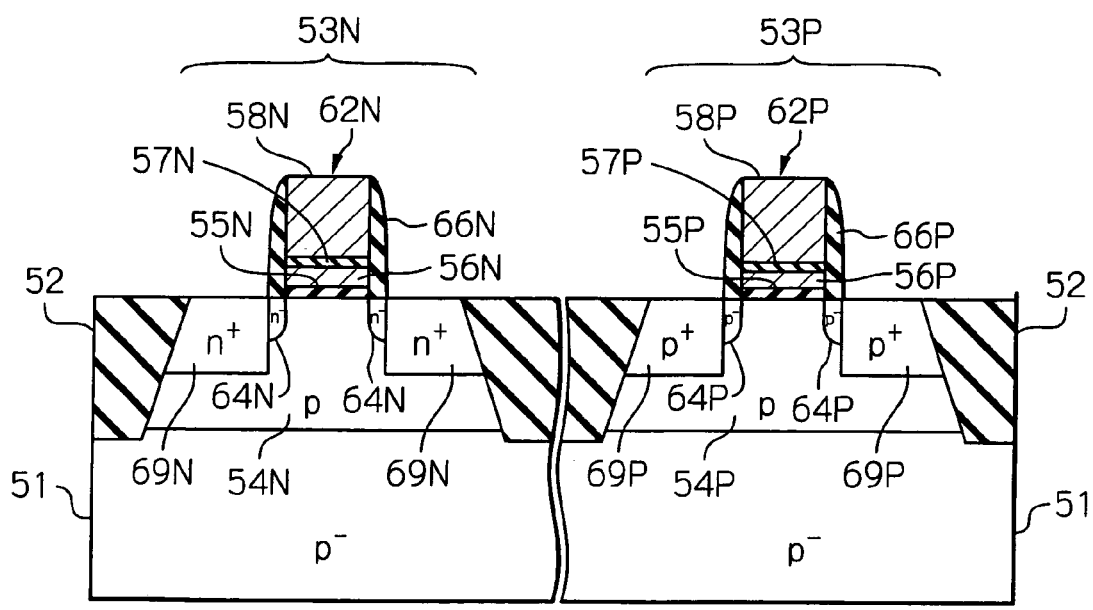

Next, referring to FIG. 7L which is a partial cross-sectional view, the $p^-$-type silicon substrate 51 with the gate electrode structures 62N and 62P is subjected to an annealing process under a temperature falling with a range between 1,000° C. and 1,100° C., so that recrystallization is carried out in the $n^-$-type source/drain regions 64N, the $n^+$-type source/drain regions 69N, the $p^-$-type source/drain regions 64P and the $p^+$-type source/drain regions 69P, resulting in production of the semiconductor device featuring the n-channel type MOS transistor and the p-channel type MOS transistor.

Note, for the annealing process, it is possible to utilize a rapid thermal anneal (ETA) process.

In the above-mentioned second embodiment, during the annealing process (FIG. 7L), grains of the polycrystalline silicon in the polycrystalline silicon layer section 56N gradually grow, but the growth of the grains is suppressed so that the polycrystalline silicon in the gate electrode layer 16N has an average grain size falling within a range between 10 nm and 150 nm, preferably 50 nm and 100 nm, due to the existence of the stopper layer section 57N.

Figure 8A:
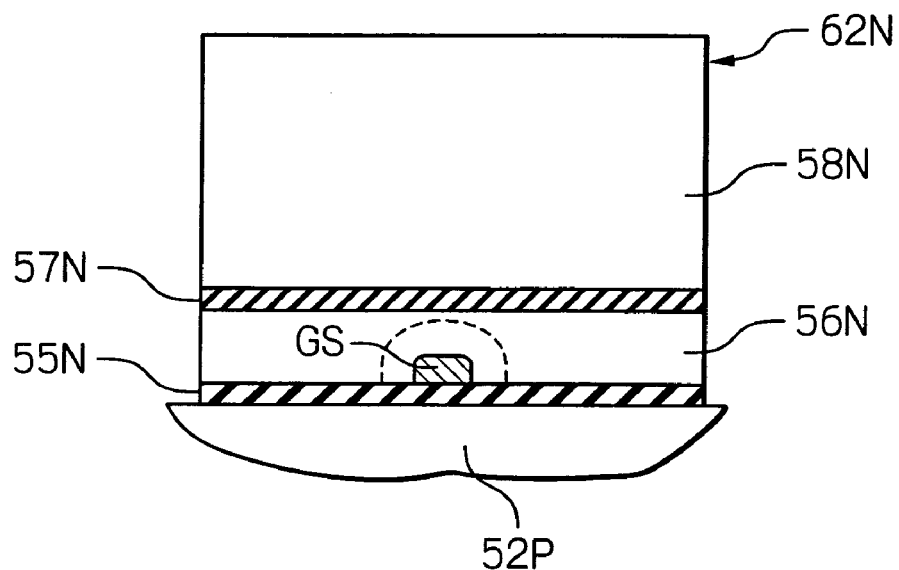
FIG. 8A is a conceptual cross-sectional view of a gate electrode layer of the n-channel type MOS transistor of FIG. 7L for explaining a growth of a grain of polycrystalline silicon in the gate electrode layer.

In particular, referring to FIG. 8A which is a conceptual cross-sectional view of the gate electrode structure 62N with the gate insulating layer 55N, reference GS indicates a grain seed in the polycrystalline silicon layer section 56N. During the annealing process, the grain seed GS gradually grows, but the growth of the grain seed GS is prevented by the stopper layer 57N, as shown by a broken line in FIG. 8A. Namely, the grain seed GS cannot grow more than the grain size shown by the broken line of FIG. 8A.

Figure 8B:
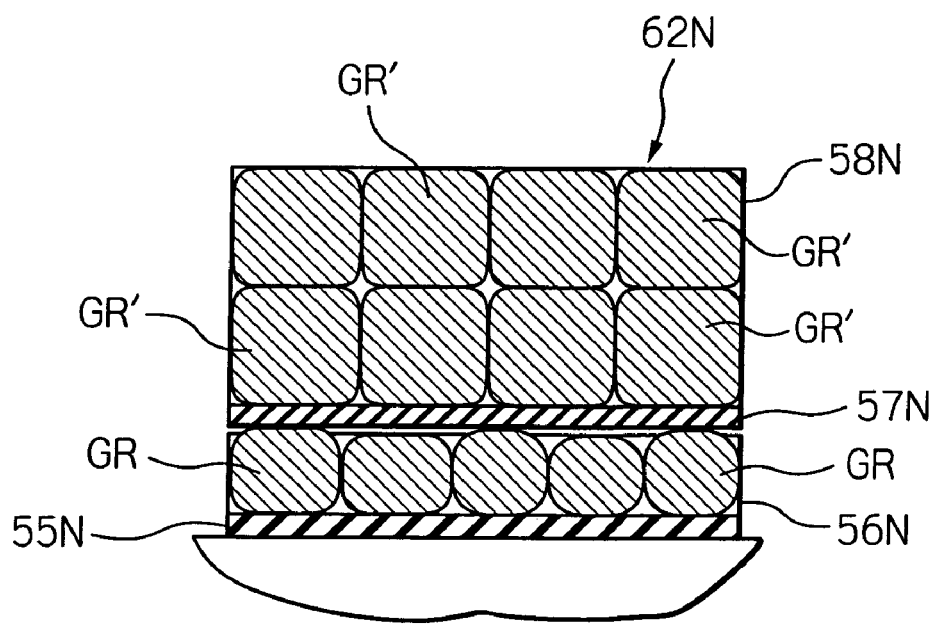
FIG. 8B is a conceptual cross-sectional view, similar to FIG. 8A, showing that the gate electrode layer is defined by the silicon grains.

Thus, as conceptually shown in FIG. 8B which is similar to FIG. 8A, the polycrystalline silicon layer section 56N is defined by the grains GR having the average grain size falling within the range between 10 nm and 150 nm. Note, in FIG. 8B, the polycrystalline silicon layer section 58N is defined by grains GR' having a larger size than the grains GR.

Similar to the above-mentioned first embodiment, since the grains in the polycrystalline silicon layer section 56N have the average grain size falling within the range between 10 nm and 150 nm, an excess physical stress cannot be exerted on the gate insulating layer 55N by the grown grains. Thus, not only can the breakdown characteristic of the gate insulating structure 62N be improved so that the characteristics of the n-channel type MOS transistor are stabilized, but it is possible to obtain a sufficient ON-current between the source (64N/69N) and the drain (64N/69N) of the n-channel type MOS transistor (see: FIG. 7L).

In a case where an SRAM device is manufactured in accordance with the above-mentioned second embodiment, after the n-type impurities such as phosphorus ions ($P^+$) or arsenic ions ($As^+$) are implanted into the polycrystalline silicon layers 56 and 58 at the n-channel type MOS transistor-formation area 53N (see: FIG. 7C), inert gas ions may be implanted into the polycrystalline silicon layers 56 and 58 at the n-channel type MOS transistor-formation area 53N for the reasons stated with reference to FIG. 6.

EXAMPLE 1

Semiconductor devices were manufactured in accordance with the first embodiment of the method according to the present invention (see: FIGS. 4A to 4L), and featured the following particulars:
1) Gate Insulating Layers (15N and 15P)
  Material: Silicon Dioxide ($SiO_2$)
  Thickness: 1.5 nm
  Method: Thermal Oxidization Process
2) Gate Electrode Layer (16N) of n-MOS Transistor
  Average Grain Size: 150 nm
  n-Type Impurity: Phosphorous (P)
  Inert Gas: Nitrogen Gas ($N_2$)
  $N_2$ Dose Amount: $1\times10^{15}$ $cm^{-2}$
  $N_2$ Diffusion Density: $1\times10^{21}$ $cm^{-3}$
3) Gate Electrode Layer (16P) of p-MOS Transistor
  Average Grain Size: 200 nm
  p-Type Impurity: Boron (B)
4) Annealing Process (FIG. 4L)
  Annealing Temperature: 1000° C.

EXAMPLE 2

Semiconductor devices were manufactured in accordance with a similar method to the first embodiment of the method according to the present invention (see: FIGS. 4A to 4L), and featured the same particulars as EXAMPLE 1 except for the following particulars:
  Gate Electrode Layer (16N) of n-MOS Transistor
    Average Grain Size: 100 nm
    $N_2$ Dose Amount; $2\times10^{15}$ $cm^{-2}$
    $N_2$ Diffusion Density: $2\times10^{21}$ $cm^{-3}$

Comparative Example 1

Semiconductor devices were manufactured in accordance with a similar method to the first embodiment of the method according to the present invention (see: FIGS. 4A to 4L), and featured the same particulars as EXAMPLE 1 except for the following particulars:
  Gate Electrode Layer (16N) of n-MOS Transistor
    Average Grain Size; 2 nm
    $N_2$ Dose Amount: $2\times10^{16}$ $cm^{-2}$
    $N_2$ Diffusion Density: $2\times10^{22}$ $cm^{-3}$ In each of EXAMPLE 1, EXAMPLE 2 and COMPARATIVE EXAMPLE 1, an ON-current of the n-channel type MOS transistor was measured. The measured results are shown in a graph of FIG. 9.

Figure 9:
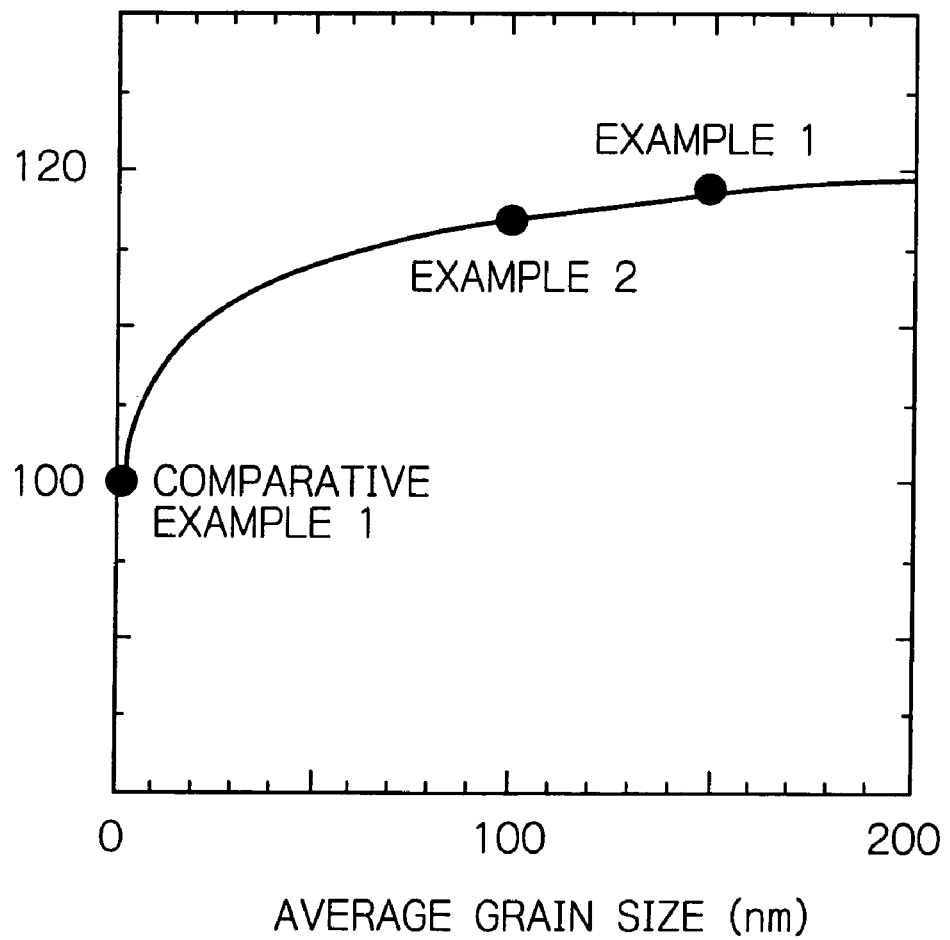
FIG. 9 is a graph showing a relationship between an ON current of an n-channel type MOS transistor and an average grain size in a polycrystalline silicon layer or gate electrode layer.

In the graph of FIG. 9, a magnitude of the ON-current, measured in COMPARATIVE EXAMPLE 1, is represented as a numerical value of 100, and magnitudes of the ON-currents, measured in EXAMPLE 1 and EXAMPLE 2, are represented as values. relative to the numerical value of 100. In short, in the graph of FIG. 9, the magnitude of the ON-current is represented by an arbitrary unit in the ordinate.

As shown in the graph of FIG. 9, the ON-current in EXAMPLE 1 was 118, and the ON-current in EXAMPLE 2 was 117.

In EXAMPLE 1, when the $N_2$ dose amount of $1\times10^{16}$ $cm^{-2}$ was substituted for $2\times10^{16}$ $cm^{-2}$, the gate electrode layer (16N) of the n-MOS transistor had the average grain size of 10 nm, and the ON-current was 107.

In each of EXAMPLE 1, EXAMPLE 2 and COMPARATIVE EXAMPLE 1, a rate of production of acceptable semiconductor devices was inspected. The inspected results are shown in a graph of FIG. 10.

Figure 10:
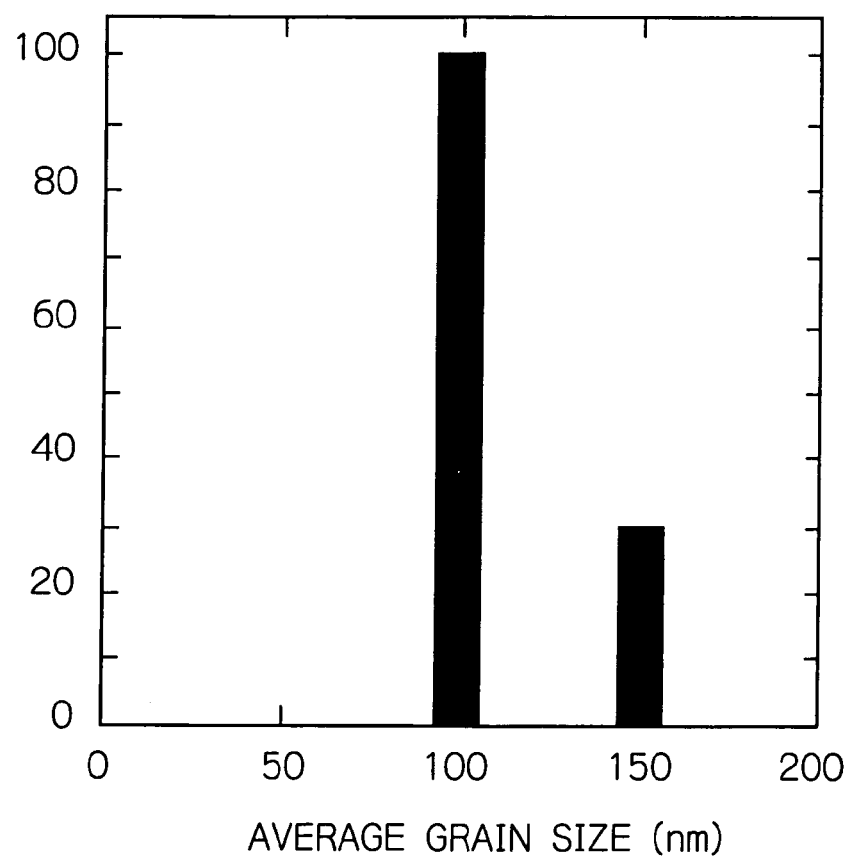
FIG. 10 is a graph showing a relationship between a rate of acceptable semiconductor device and an average grain size in polycrystalline silicon layer or gate electrode layer thereof.

As shown in the graph of FIG. 10, when the average grain size was 100 nm (EXAMPLE 2), the rate of production of the acceptable semiconductor devices was 100%. Also, when the average grain size was 150 nm (EXAMPLE 1), the rate of production of the acceptable semiconductor devices was 30%. Further, when the average grain size exceeded 160 nm, the rate of production of the acceptable semiconductor devices was less than 10%.

Accordingly, when the polycrystalline silicon of the gate electrode layer 16N had the average grain size falling within the range between 10 nm and 150 nm, preferably 50 nm and 100 nm, it was found that not only can the breakdown characteristic of the gate insulating layer 15N be improved so that the characteristics of the n-channel type MOS transistor is stabilized, but also it is possible to obtain the sufficient ON-current between the source (21N/26N) and the drain (21N/26N) of the n-channel type MOS transistor source/drain of the regions (see: FIG. 4L).

Comparative Example 2

Semiconductor devices were manufactured in accordance with a similar method to the first embodiment of the method according to the present invention (see: FIGS. 4A to 4L), and featured the same particulars as EXAMPLE 2 except for the following particulars:
  Gate Electrode Layer (16N) of n-MOS Transistor
    Average Grain Size: 170 nm
    $N_2$ Dose Amount: $1\times10^{15}$ $cm^{-2}$
    $N_2$ Diffusion Density: $1\times10^{21}$ $cm^{-3}$

Comparative Example 3

Semiconductor devices were manufactured in accordance with a similar method to the first embodiment of the method according to the present invention (see: FIGS. 4A to 4L), and featured the same particulars as EXAMPLE 2 except for the following particulars:

Gate Electrode Layer (16N) of n-MOS Transistor
Inert Gas: None
Average Grain Size: 300 nm In each of EXAMPLE 2, COMPARATIVE EXAMPLE 2 and COMPARATIVE EXAMPLE 3, a relationship between a gate leak current and a cumulative frequency was inspected. The inspected results are shown in a graph of FIG. 11.

Figure 11:
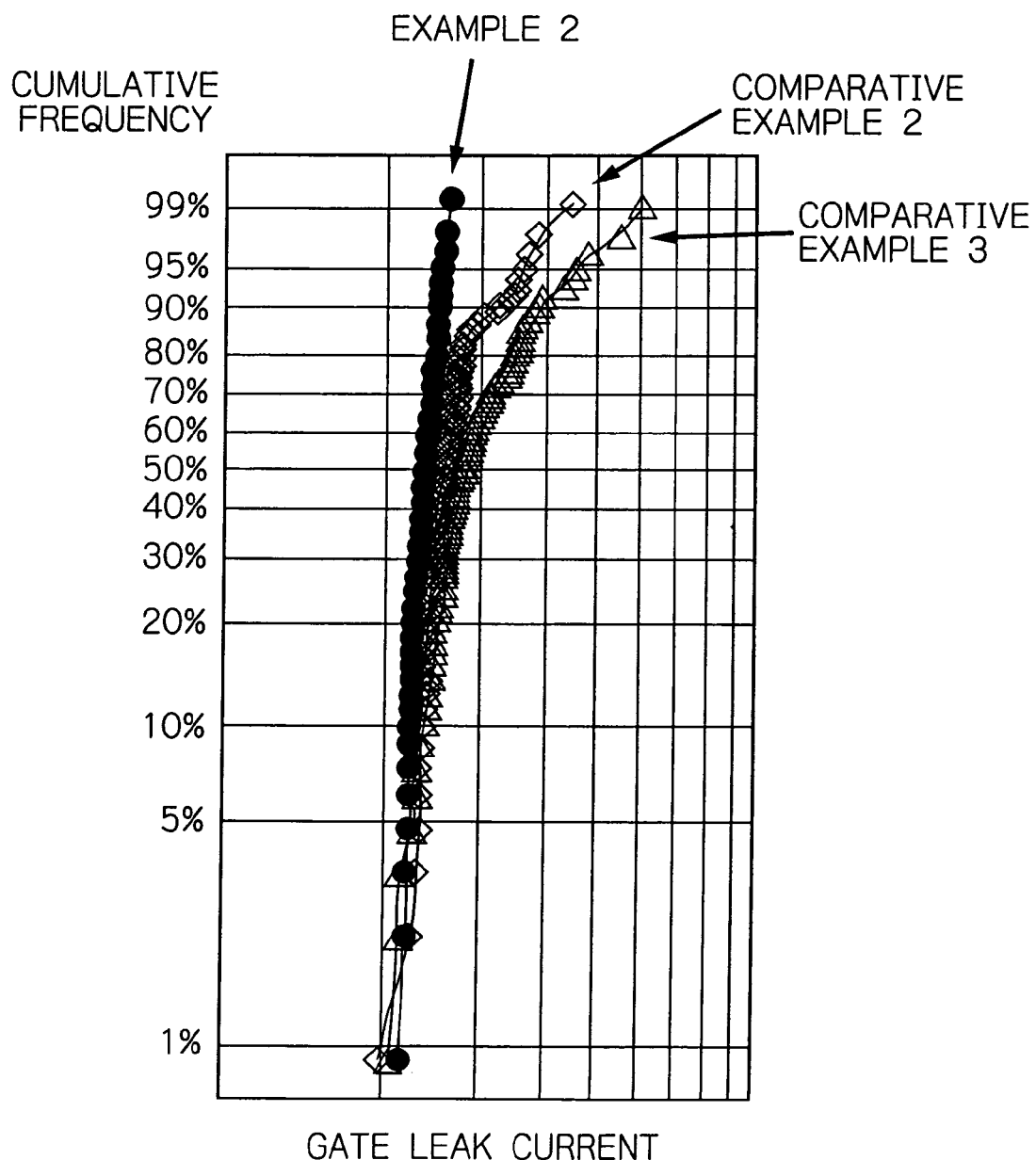
FIG. 11 is a graph showing a relationship between a cumulative frequency and a gate leak current in an n-channel type MOS transistor.

As shown in the graph of FIG. 11, in COMPARATIVE EXAMPLE 2 and COMPARATIVE EXAMPLE 3, it was found that the gate leak current was increased, resulting in deterioration of a breakdown characteristic of the gate insulating layer (15N).

EXAMPLE 3

Semiconductor devices were manufactured in accordance with the second embodiment of the method according to the present invention (see: FIGS. 7A to 7L), and featured the following particulars:
1) Gate Insulating Layers (55N and 55P)
   Material: Silicon Dioxide (SiO$_2$)
   Thickness: 1.5 nm
   Method: Thermal Oxidation Process
2) First Gate Electrode Layers (56N) of n-MOS Transistors
   Average Grain Size; 70 nm
   Thickness: 30 nm
   n-Type Impurity: Phosphorous (P)
3) Second Gate Electrode Layers (58N) of n-MOS Transistor
   Average Grain Size: 300 nm
   n-Type Impurity: Phosphorous (P)
4) First Gate Electrode Layers (56P) of p-MOS Transistors
   Average Grain Size: 70 nm
   Thickness: 30 nm
   p-Type Impurity: boron (B)
5) Second Gate Electrode Layers (58P) of p-MOS Transistor
   Average Grain Size: 300 nm
   p-Type Impurity: boron (B)
6) Stopper Layer (57N, 57P)
   Material: Silicon Dioxide (SiO$_2$)
   Thickness: 1 nm
   Method: Thermal Oxidation Process
7) Annealing Process (FIG. 7L)
   Annealing Temperature: 1000° C.

Comparative Example 4

Semiconductor devices were manufactured in accordance with a similar method to the second embodiment of the method according to the present invention (see: FIGS. 7A to 7L), and featured the same particulars as EXAMPLE 3 except that no stopper layer (57N, 57P) was formed.

In each of EXAMPLE 3 and COMPARATIVE EXAMPLE 4, a relationship between a gate leak current and a cumulative frequency was inspected. The inspected results are shown in a graph of FIG. 12.

As shown in the graph of FIG. 12, in COMPARATIVE EXAMPLE 4, it was found that the gate leak current was increased, resulting in deterioration of a breakdown characteristic of the gate insulating layer (55N).

Also, when the stopper layer (57N) was 2 nm, it was found that the n-channel type MOS transistor exhibited stable electrical characteristics similar to those of EXAMPLE 3. On the other hand, when the stopper layer (57N) was 3 nm, it was found that electrical characteristics of the n-channel type MOS transistor deteriorated.

In addition, when the second gate electrode layer or polycrystalline silicon layer (56N) was 30 nm, electrical characteristics of the n-channel type MOS transistor were stable. Also, when the second gate electrode layer or polycrystalline silicon layer (56N) was 60 nm, it was found that a breakdown characteristic of the gate insulating layer (55N) deteriorated.

Finally, it will be understood by those skilled in the art that the foregoing description is of preferred embodiments of the method and the device, and that various changes and modifications may be made to the present invention without departing from the spirit and scope thereof.

The invention claimed is:

1. A method for manufacturing a semiconductor device, which comprises:
    preparing a semiconductor substrate;
    forming an insulating layer on said semiconductor device, said insulating layer having a thickness of at most 1.6 nm;
    forming a polycrystalline silicon layer on said insulating layer;
    implanting n-type impurities into said polycrystalline silicon layer;
    implanting inert gas molecules or atoms into said polycrystalline silicon layer;
    forming a gate electrode structure including a gate insulating layer derived from said insulating layer, and a gate electrode layer derived from said polycrystalline silicon layer; and
    subjecting said gate electrode structure to an annealing process so that the polycrystalline silicon in said gate electrode layer has an average grain size falling within a range between 10 nm and 150 nm.

2. The method as set forth in claim 1, wherein the inert gas implantation is carried out at a density falling within a range between $2\times10^{15}$ cm$^{-2}$ and $1\times10^{16}$ cm$^{-2}$.

3. A method for manufacturing a semiconductor device, which comprises:
    preparing a semiconductor substrate;
    forming a first insulating layer on said semiconductor device, said insulating layer having a thickness of at most 1.6 nm;
    forming a first polycrystalline silicon layer on said insulating layer;
    forming a second insulating layer on said first polycrystalline silicon layer;
    forming a second polycrystalline silicon layer on said second insulating layer;
    implanting n-type impurities into said first and second polycrystalline silicon layers;
    implanting inert gas molecules or atoms into said first and second polycrystalline silicon layers;
    forming a gate electrode structure including a gate insulating layer derived from said first insulating layer, a first gate electrode layer derived from said first polycrystalline silicon layer, a stopper layer derived from said second insulating layer, and a second gate electrode layer derived from said second polycrystalline silicon layer; and
    subjecting said gate electrode structure to an annealing process so that the polycrystalline silicon in said first gate electrode layer has an average grain size falling within a range between 10 nm and 150 nm.

4. The method as set forth in claim 3, wherein said second insulating layer is composed of one selected from the group consisting of silicon dioxide, silicon nitride and silicon carbide.

5. The method as set forth in claim 3, wherein said first polycrystalline silicon layer has a thickness falling within a range between 10 nm and 50 nm.

* * * * *